(12) United States Patent
Smith

(10) Patent No.: US 9,626,880 B2
(45) Date of Patent: *Apr. 18, 2017

(54) MODULAR SYSTEM OF BUILDING WITH ELASTIC MATERIAL AND POTENTIAL APPLICATIONS

(71) Applicant: William Smith, O'Fallon, IL (US)

(72) Inventor: William Smith, O'Fallon, IL (US)

( * ) Notice: Subject to any disclaimer, the term of this patent is extended or adjusted under 35 U.S.C. 154(b) by 4 days.

This patent is subject to a terminal disclaimer.

(21) Appl. No.: 14/476,782

(22) Filed: Sep. 4, 2014

(65) Prior Publication Data

US 2016/0071433 A1    Mar. 10, 2016

(51) Int. Cl.
```
G09B 23/00    (2006.01)
G09B 23/02    (2006.01)
G09B 23/06    (2006.01)
G09B 23/24    (2006.01)
G06F 17/50    (2006.01)
G09B 23/26    (2006.01)
```
(52) U.S. Cl.
CPC ............ *G09B 23/00* (2013.01); *G06F 17/50* (2013.01); *G09B 23/24* (2013.01); *G09B 23/26* (2013.01)

(58) Field of Classification Search
CPC ...... A63H 33/10–33/12; A63H 33/06–33/067; G09B 23/26; G09B 23/24; G09B 23/00; G06F 17/50

USPC ........ 428/12, 33, 44, 45, 47, 48, 51, 52, 53, 428/57, 408; 434/277, 278, 279, 280, 434/281, 365; 446/85, 107, 124, 125, 446/126; 52/653.1, 653.2; 703/1

See application file for complete search history.

(56) References Cited

U.S. PATENT DOCUMENTS 3,998,003 A * 12/1976 Rosenbaum ............... 446/119
2002/0107679 A1 * 8/2002 Roelofs .................... 703/22

FOREIGN PATENT DOCUMENTS

WO    WO 2014/124293 A1 *  8/2014

* cited by examiner

*Primary Examiner* — Joanna Pleszczynska
(74) *Attorney, Agent, or Firm* — Grace J. Fishel

(57) ABSTRACT

A system of construction that uses a discrete repertoire of elastic modular units that interconnect forming assemblies of diverse curved geometries applicable at any scale.
Each modular unit is formed with linear elements with less than infinite elastic modulus. The modular units connect to one another under tension creating structural networks that have stored elastic potential energy.
The linear elements may be formed of carbon based composite materials and their future permutations, including smart materials. The modular assemblies created using this system have application in terrestrial, space and aquatic environments and as an educational tool.

14 Claims, 26 Drawing Sheets

$$\frac{c}{a+b} \approx 1.62$$

$\frac{a}{b} \approx 1.62$ conformational change conformational change

MODULAR SYSTEM OF BUILDING WITH ELASTIC MATERIAL AND POTENTIAL APPLICATIONS

FIELD OF TECHNOLOGY

This invention comprises a building system design that is tailored to the use of composite materials having controllable physical properties.

BACKGROUND

This invention comes from the idea that modern and future composite materials require a novel building system to take advantage of their phenomenal physical properties.

Current building systems are ill equipped to take full advantage of the physical properties of modern composites and future smart materials.

Current and future exotic composite materials require an elegant system of construction that will allow the creation of infinite structural diversity.

Helixes, spheres, quasicystalline planes, amorphous shapes, branching structures, etc. can be built using this invention, and these types of complex structures have applications that will emerge as new exotic materials are developed.

Current building systems are not designed to take advantage of the levels of bending stress made available in many composite and smart materials.

A structure built of curved elastic elements under stress is better suited to controlled shape morphing than a structure built with straight elements.

The level of structural density that defines many current building systems will render them obsolete when the specific strength of future composite materials reach a high enough level.

Additive and reductive changes made to a structure over time is difficult when using existing building systems because of their inflexible nature.

Current building systems are diverse in type because they are needed for different applications. As more adaptable/adjustable/tunable materials become available, the diversity of applications afforded by these adjustable materials will lessen the need for so many building strategies. An elegantly simple building system using adaptable materials will be best suited to many niches.

Current building systems have difficulty adapting to potentially damaging natural phenomena. Building with straight elements is not conducive to flexibility or the benign absorption of external forces.

A building system capable of functioning at many scales is needed in an environment where materials exist that will allow the creation of structures hitherto impossible at many scales.

SUMMARY

This describes a modular building system tailored to the use of carbon allotrope based composite materials.

This modular building system tests the boundary of scale by constructing macroscopic structures based on microscopic construction principles. The products assembled using this system are highly structurally integrated. The products are structurally fluid and the term growth could describe the construction process. This system of construction has terrestrial, aquatic and aerospace applications. The system is capable of producing isotropic and anisotropic structures.

Recent and future advances in material and computer science technologies make this invention feasible. Its goal is to create macro structures that reach or surpass the level of sophistication found in nature at the microscopic level. This invention is a natural macroscopic development that inversely parallels our exploration and application of nanotechnology.

I state that a repertoire of macroscopic composite material modules can function to create a seemingly infinite variety of structural arrangements. The modules are analogous to the organic molecules that make up the matter of life. The diversity of organic matter's shape and scale has its roots in the structure of the molecules that comprise it.

Like these composite material modules, organic molecules are elastic structures. The elastic energy stored in atomic bonds is potential mechanical energy. This stored energy enhances the molecule's structural integrity and allows for structural changes in response to intramolecular interactions. This scenario could soon be made available macroscopically by advances in material science. The system I propose is a vehicle for the creation of smart structures built from smart composite materials.

Computer science advances are important to the efficient application of this idea, in particular software and hardware platforms that model the behavior of macromolecular structures.

DETAILED DESCRIPTION

This building system's modular design has a close relationship to the structure of organic cyclic molecules. The module/molecular connection provides useful structural and behavioral analogies. It will be used as a tool to help describe the intricacies of this invention.

The modules comprising this building system range in their level of complexity. Based on these differences in complexity, the modules are grouped into four families, A,B.C, and D.

Figure 1A:
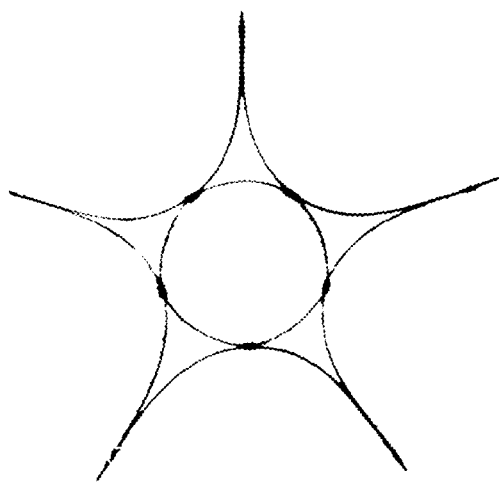
FIG. 1A shows a the five-sided module structure within family A.
Figure 1B:
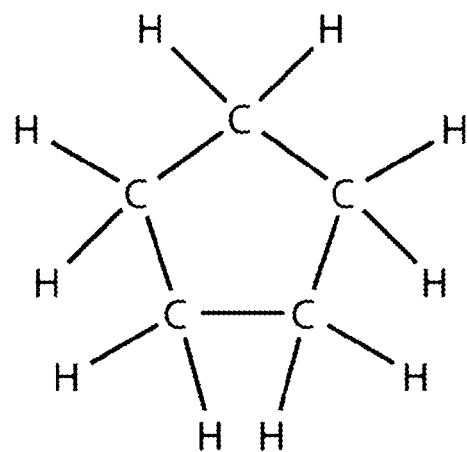
FIG. 1B shows the molecular analog of a five-sided family A module.
Figure 1C:
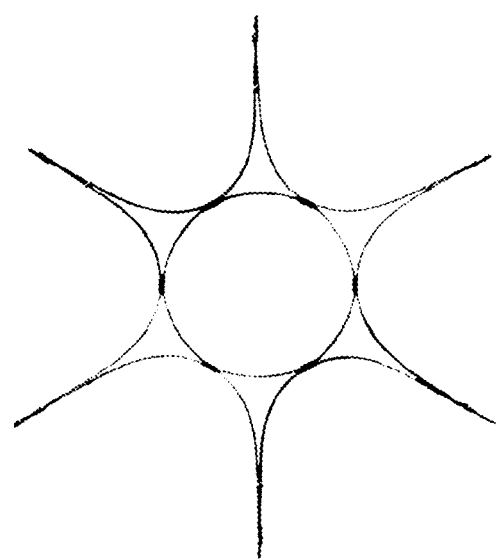
FIG. 1C shows the six-sided module structure within family A.
Figure 1D:
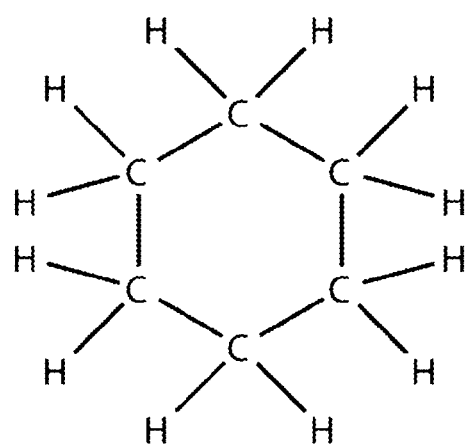
FIG. 1D shows the molecular analog of a six-sided family A module.
Figure 2:
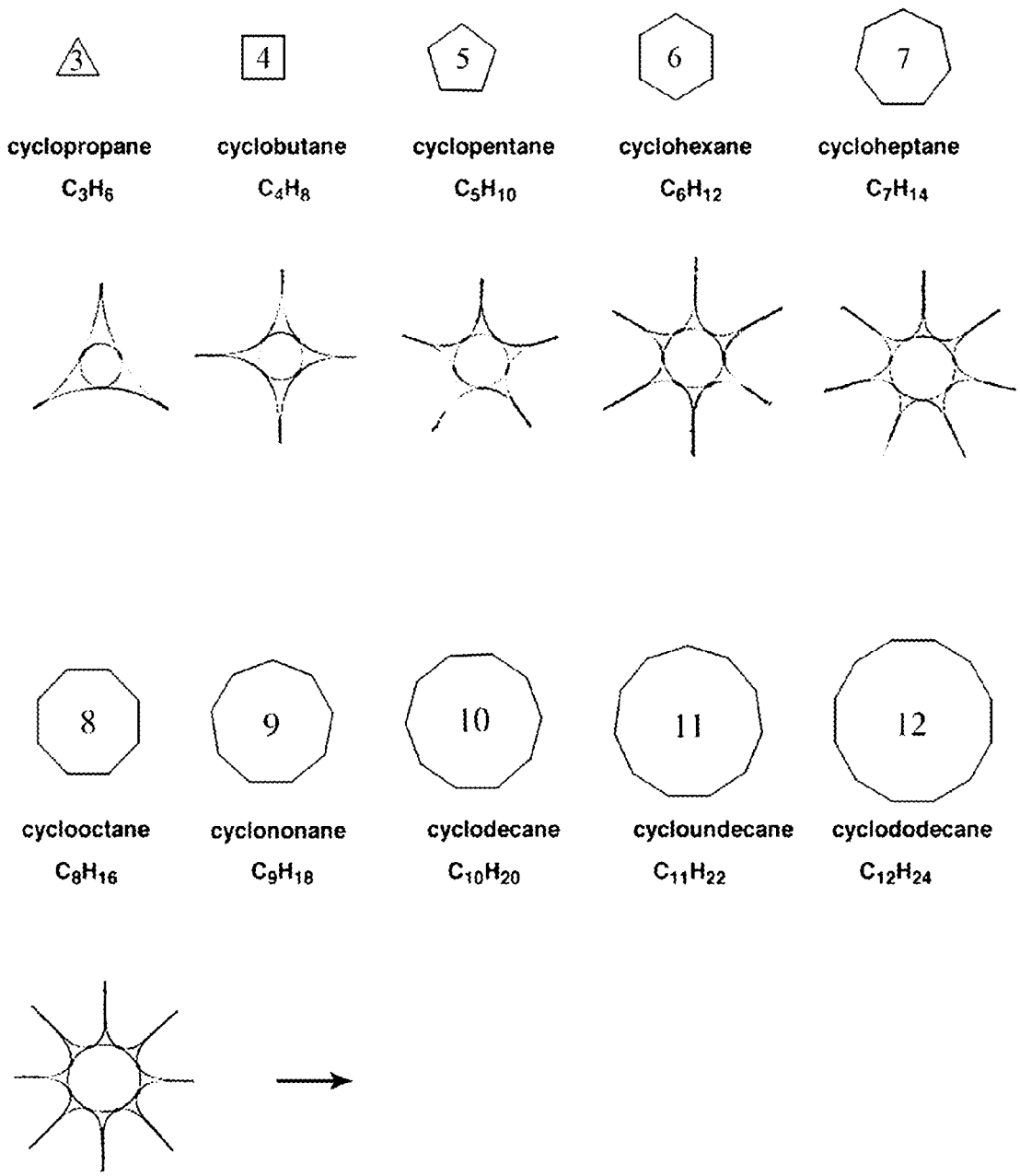
FIG. 2 shows many of the module types that comprise family A and illustrates their connection to the molecular family of cycloalkanes.

The most elemental module grouping is family A. Family A is made up of a repertoire of modules that includes the five-sided module depicted in FIG. 1A. This module type is similar in structure to the cyclopentane molecule shown in FIG. 1B. FIG. 1C represents the family A six-sided module design. This six-sided module is structurally analogous to the molecular structure cyclohexane seen in FIG. 1D. This module/molecule analogy extends to the entire chemical family of cycloalkanes. The chemical family of cycloalkanes shown in FIG. 2 are relatively slight structures due to the single bond configuration found within their rings. The corresponding module configurations found in family A mirror the cycloalkanes.

Figure 3A:
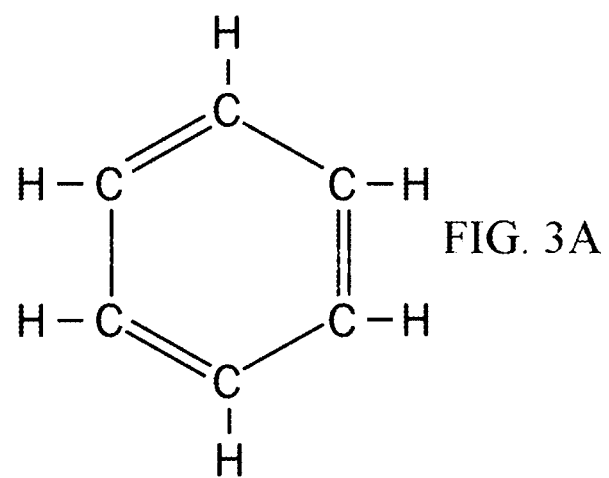
FIG. 3A shows the double bond configuration of the benzene ring.
Figure 3B:
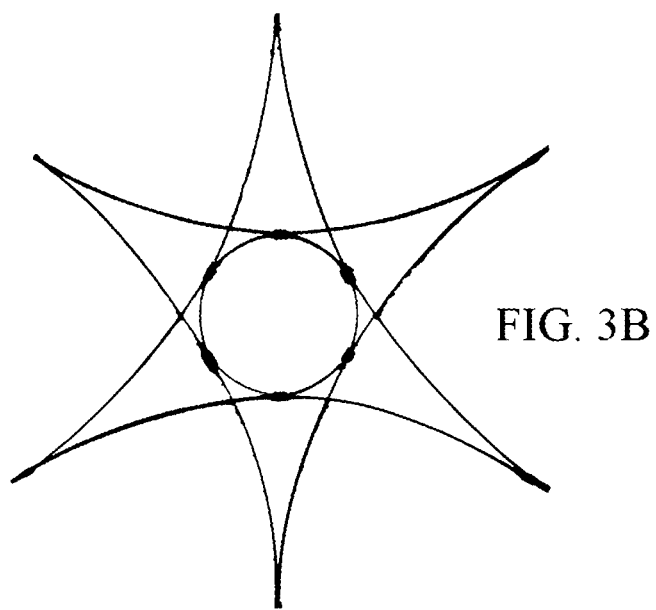
FIG. 3B shows the six-sided family B module analogous to benzene.
Figure 3C:
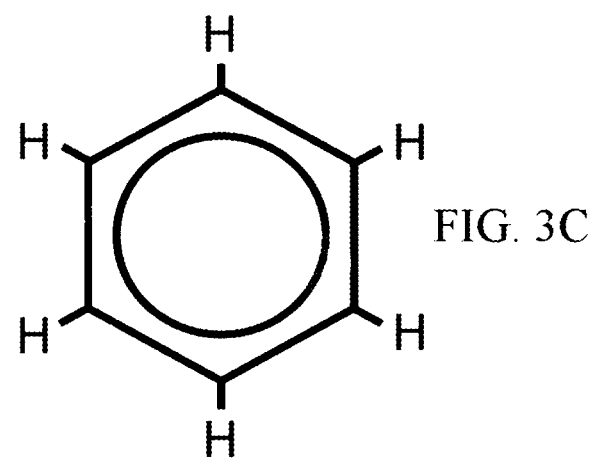
FIG. 3C shows the resonate structure of benzene.

Family B modules are similar to family A but have more robust rings. They can be thought of as having single rings composed of all double bonds. The family B modules' best molecular analogy are ringed aromatic compounds, an example being benzene with is depicted in FIGS. 3A and 3C. The family B module equivalent of benzene is shown in drawing FIG. 3B. FIG. 3C illustrates that the benzene molecule's three double bonds are free to pass around the ring.

Figure 4:
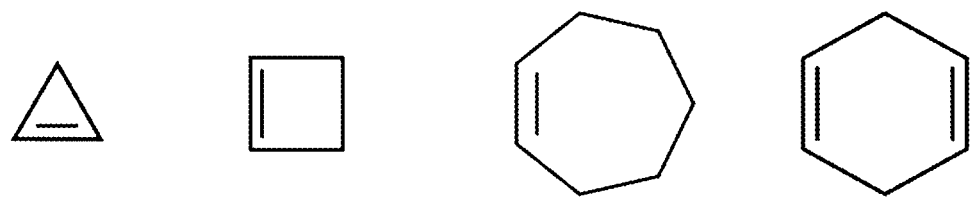
FIG. 4 shows the molecular structure of several cycloalkenes.
Figure 5A:
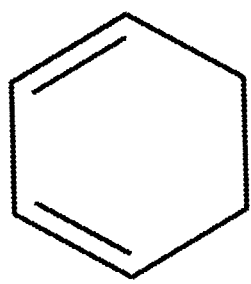
FIG. 5A shows a specific six-sided cycloalkene molecule.
Figure 5B:
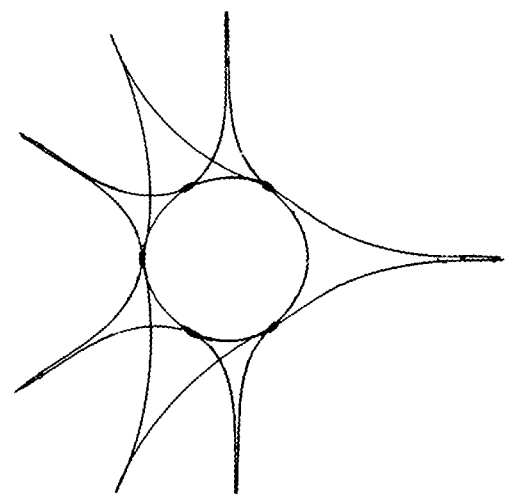
FIG. 5B shows a specific five-sided cycloalkene molecule.
Figure 5C:
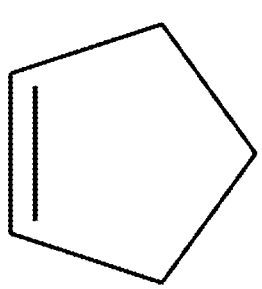
FIG. 5C shows a six-sided module within family C.
Figure 5D:
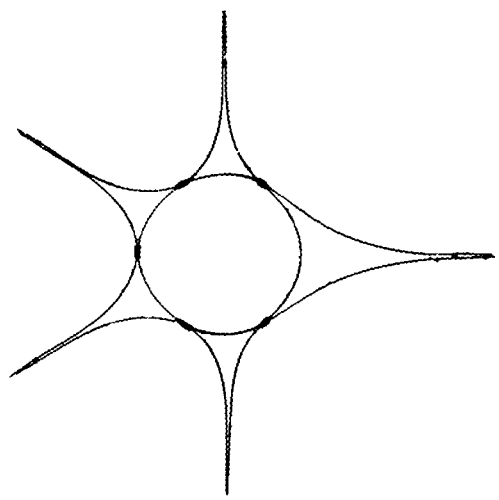
FIG. 5D shows a five-sided module within family C.

The hybridization of module families A and B defines module family C. This group can incorporate any combination of single and double bond configurations within their rings. Their molecular analogy is the family of cycloalkenes. Several cycloalkene molecules shown in FIG. 4. FIGS. 5A and 5B show two cycloalkene molecules. Their family C module equivalents are represented in FIGS. 5C and 5D. There is a close relationship between the elastic nature of atomic bonds and the elastic nature of the modules comprising this invention.

Figure 6A:
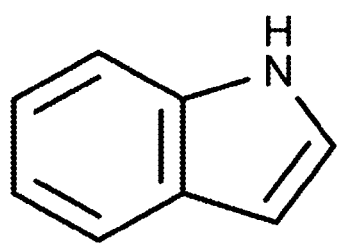
FIG. 6A shows a specific two-ringed polycyclic molecule.
Figure 6B:
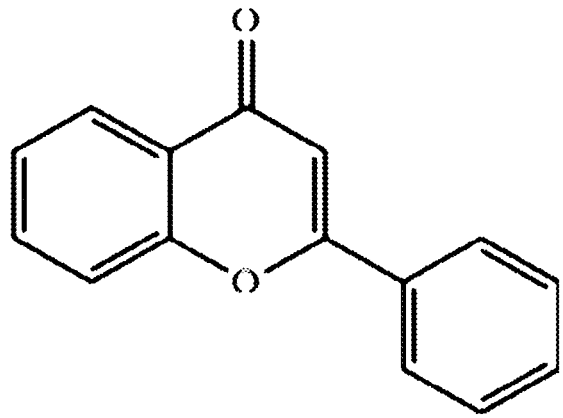
FIG. 6B shows a specific three-ringed polycyclic molecule.
Figure 6C:
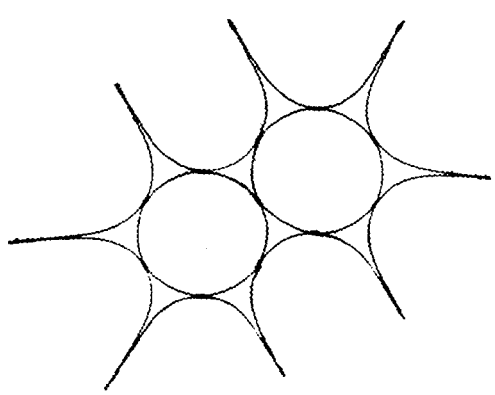
FIG. 6C shows a three-ringed module within family D.
Figure 6D:
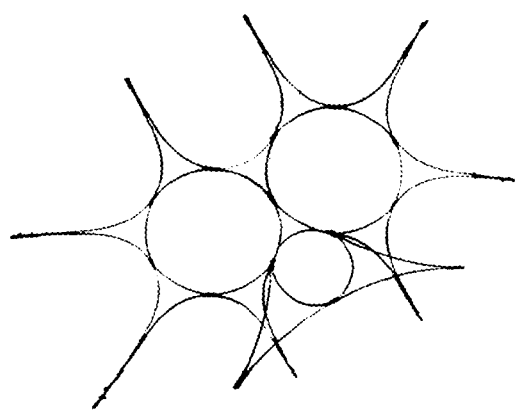
FIG. 6D shows a three-ringed module within family D.

Family D modules have the most complex architecture. This group combines the diverse bond configurations of families A, B and C along with having multiple interconnected rings. The group's molecular analogy is the polycyclic compounds. Examples are shown in FIGS. 6A and 6B. FIGS. 6C and 6D represent two multiple ringed structures found within family D. The most distinguishing structural feature of this family is the presence of interconnected rings. The number of unique module structures that exist within this family is vast.

Figure 7:
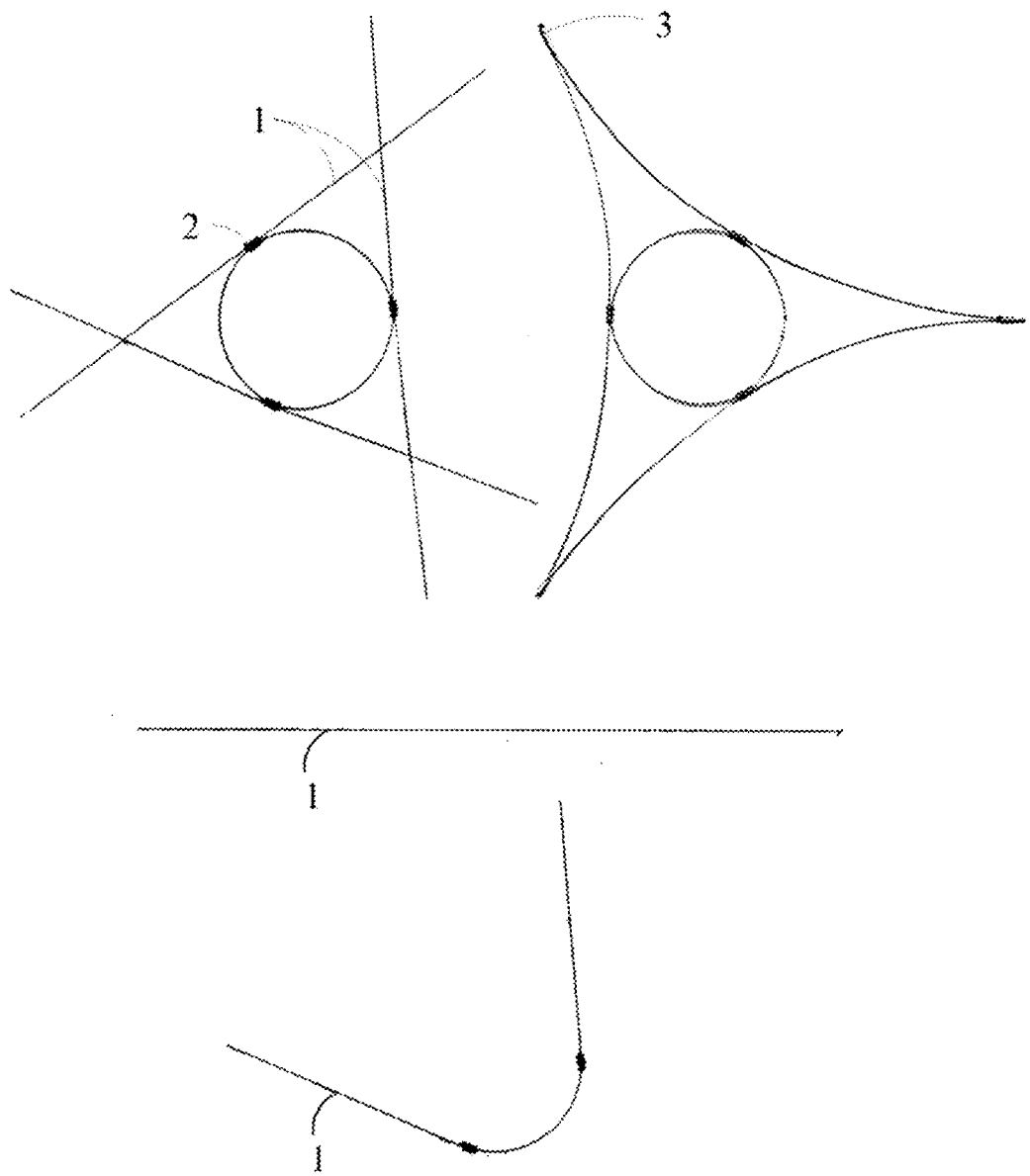
FIG. 7 illustrates the assembly of a three-sided module within family A.

All modules are built from linear component parts and hardware. The basic assembly process is illustrated in FIG. 7. The linear elements' labeled 1, form intramodular connections within the ring at each focus, labeled 2. The linear elements make sequential bilinear connections as they form the module's central ring. The elements run bilinearly tangent to the ring in opposite directions. The linear elements join to form potential intermodular connection points around the module's periphery and labeled 3. The three-sided module seen in FIG. 7 is from family A. It has three intramodular connection points (2), three intermodular connection points (3) and is made up of three linear elements (1).

Figure 8A:
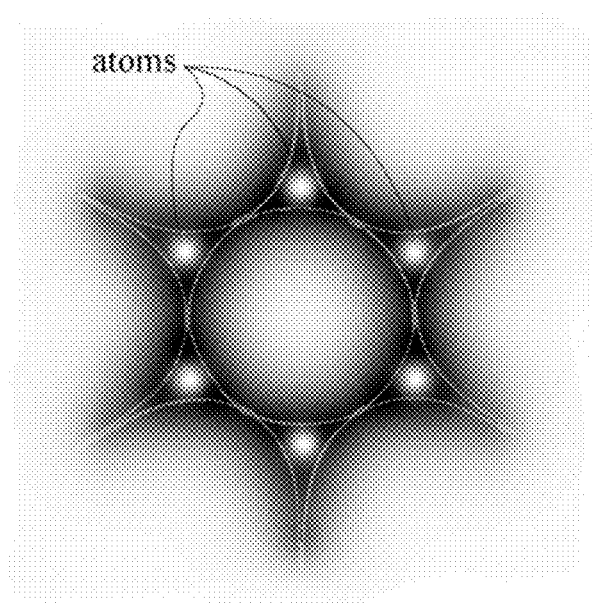
FIG. 8A shows a STM charge density plot of benzene.
Figure 8B:
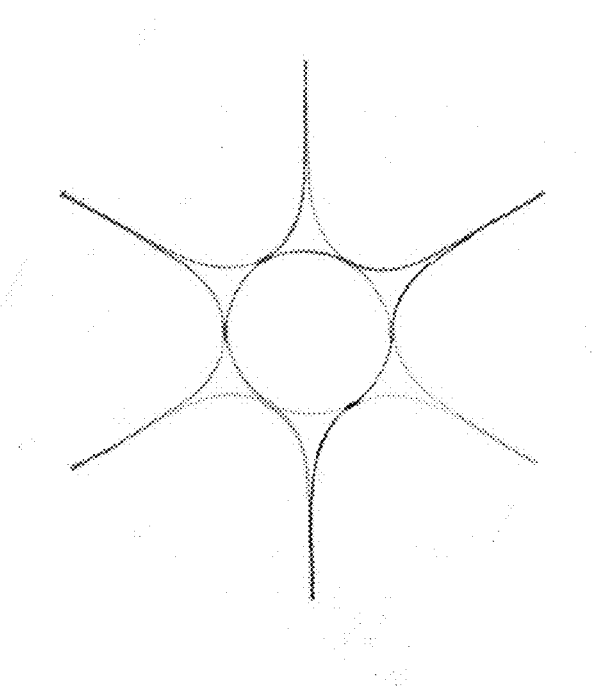
FIG. 8B shows a six-sided module within family A.

Linear element connection points are analogous to the atomic bonds that form between or within ringed molecules. Connections between modules (intermodular) are not as strong as the connections that make up the central ring structure (intramodular). Intermodular and intramodular connections have different elastic properties that need to be explored. Each linear element can be thought of as being an atom. FIG. 8A is a tunneling electron micrograph of a six-sided benzene molecule's charge density. FIG. 8B shows a six-sided module made of six linear elements. This module's structural elasticity is analogous to the benzene molecule's internal forces.

Figure 9:
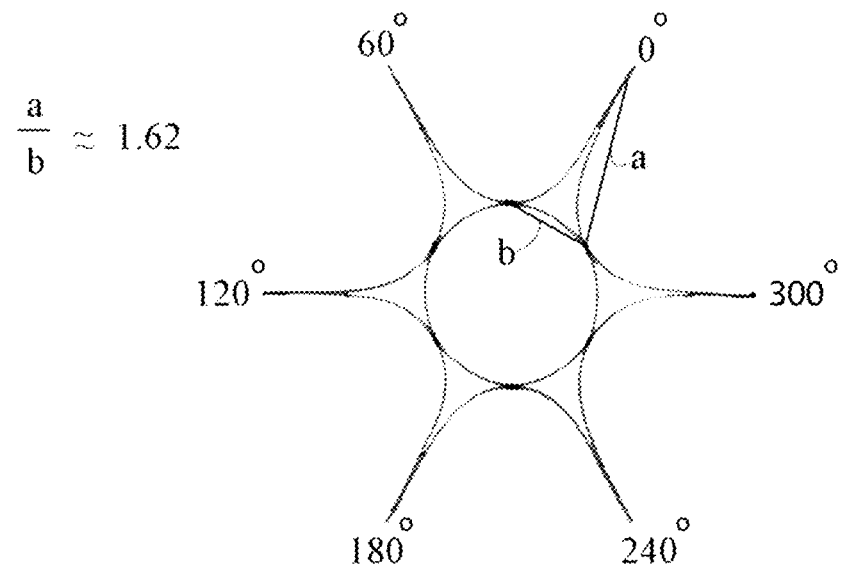
FIG. 9 shows the geometry of a module within family A and family B.
Figure 9:
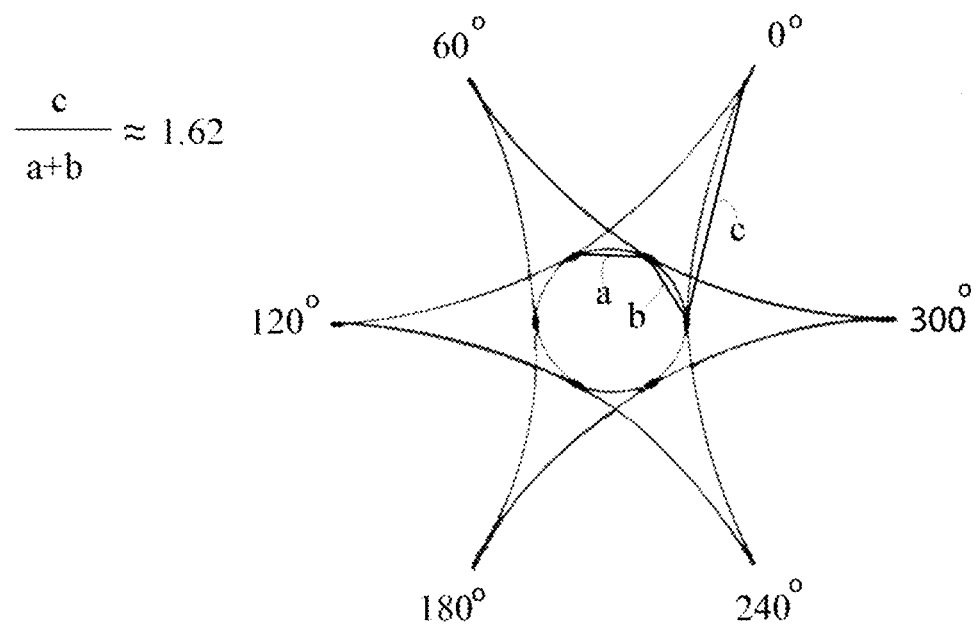

There is a general relationship between each module's geometric proportions and the golden ratio as seen in FIG. 9. There is evidence that this phi relationship exists within the molecular geometries of all ringed carbon based compounds. In nature bond lengths and strengths depend on the elements involved. For this reason the modules' geometry references only organic chemistry.

Figure 10:
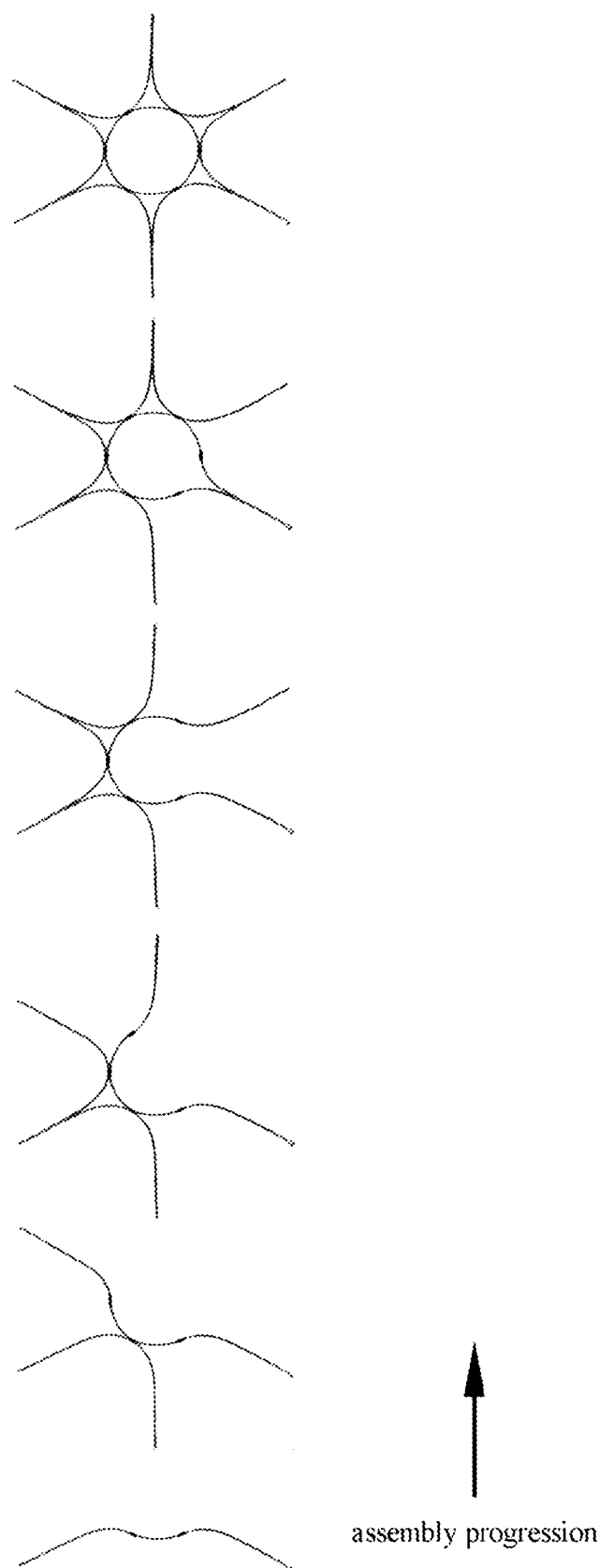
FIG. 10 illustrates the sequential assembly of a six-sided module within family A.

As mentioned, modules within family A are made up of linear elements. These elements are symmetrically positioned within each modular assembly. FIG. 10 illustrates the sequential assembly of six individual linear elements into a six-sided module. In this case each linear element has the same stress placed on it within the modular assembly.

Figure 11:
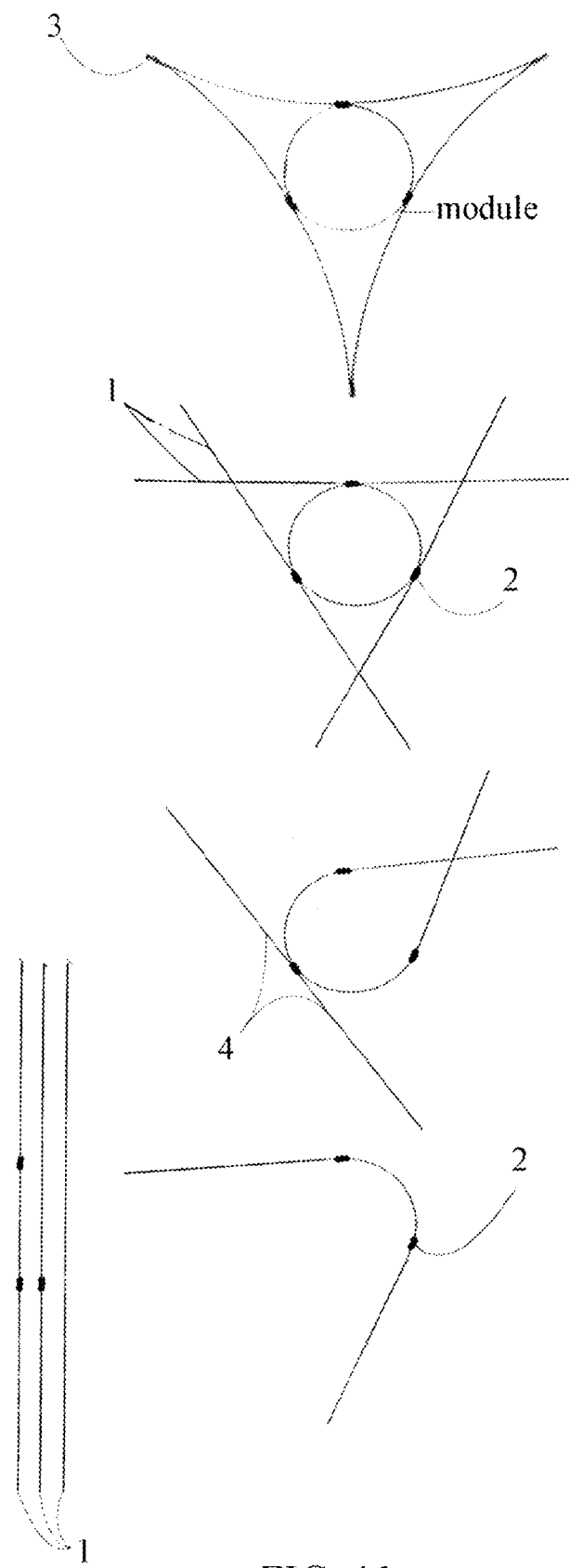
FIG. 11 shows the connections and stresses placed within a module during assembly.

FIG. 11 depicts the assembly of an arbitrary module within family A using three linear elements. All the modules within family A and B are built using linear elements of identical length like those labeled 1 in FIG. 11. Those linear elements after becoming assembled into a module are also labeled as 1. The linear elements are straight prior to becoming the curved structure of the module. Because the elements are elastic, the module contains stored energy. The linear elements are assembled sequentially into a ring. The ring is punctuated by arms that tangentially exit the structure at specific angles around the ring's periphery (4). These linear elements affix to one another intramodularly at foci located around the ring (2). Modules will interconnect at intermodular connection points labeled 3.

Figure 12:
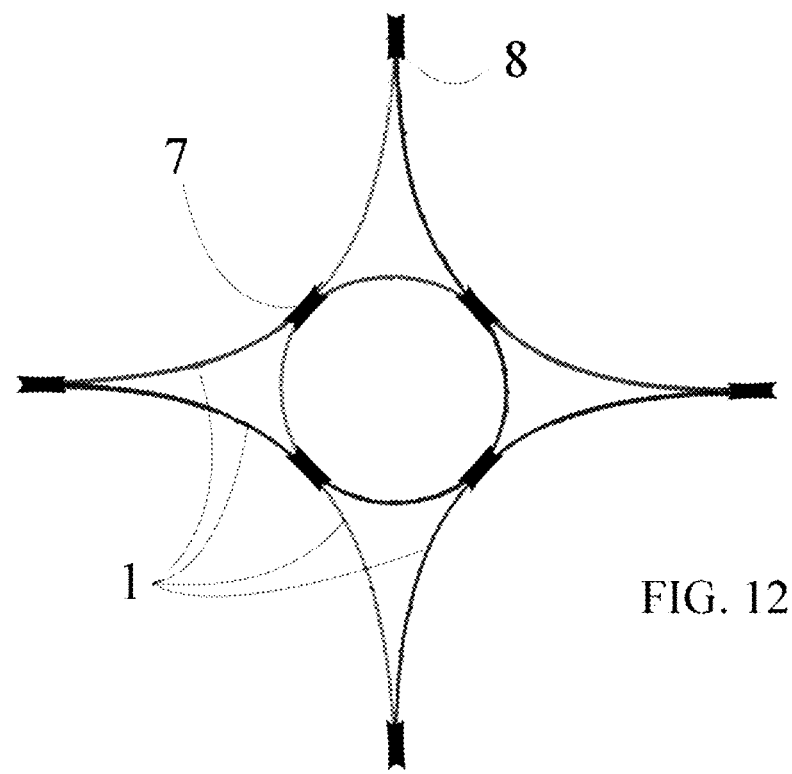
FIG. 12 shows the individual placement of the linear elements within a module.

Module connections require hardware shown in FIG. 12, labeled 7 and 8. The foci connection hardware labeled 7 holds the elements in place. The hardware connectors labeled 8 allow modules to interconnect. When smart materials are used, 7 and 8 type connectors act to electrically isolate the elements from one another. The hardware labeled 7 and 8 may incorporate electronic components that relate to the use and control of smart materials. The addressing and stimulation of the individual smart material elements within a module may involve electronics that are located within the hardware. The four linear elements labeled 1 in figure FIG. 12 are colored to show their unique orientation and their electrical isolation within the module assembly.

An alternative to assembling the modules from individual elements could involve the use of modern casting, molding or 3D printing techniques, forming integrated modules with or without individual parts. Molding and 3D printing are better adapted to gross production, greater structural complexity and control circuit integration. All unit module types are anisotropic structures.

Module Families

Module families are grouped based on structural similarity and complexity. Any combination of intra or extra familial module connections is possible.

Figure 13:
FIG. 13 shows the diversity of cross sections that could apply to the linear elements that make up all modules.
Figure 13:
Figure 13:
Figure 13:

The various module types can have any number of connection points and representative linear elements. The modules' linear elements described to this point have had a solid circular cross section. The modules can also be constructed of linear elements that are hollow solids (cellular solids) or solid with asymmetric and symmetric cross sections as shown in FIG. 13. When compared to elements with symmetric cross sections, those with asymmetric cross sections would change the structural and behavioral characteristics of the module.

Figure 14A:
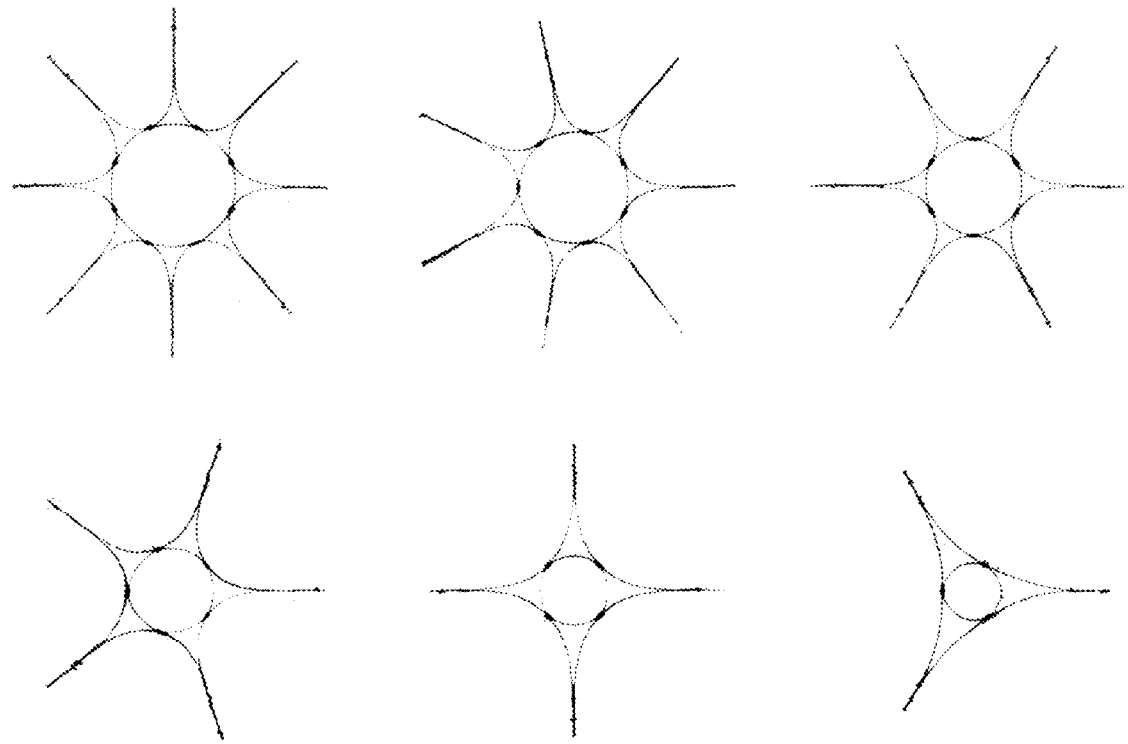
FIG. 14A shows a range of family A modules.
Figure 14B:
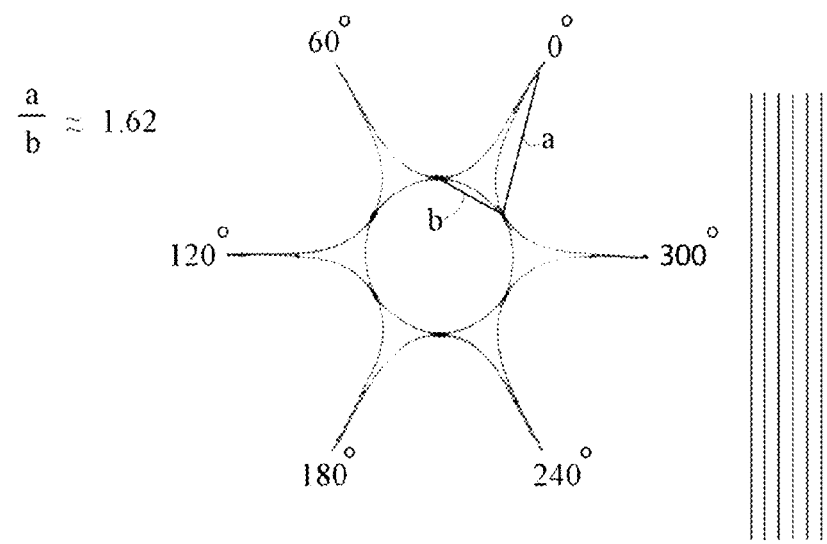
FIG. 14B shows the geometry a six-sided module within family A.

The modules of family A are radially symmetric structures composed of linear elements of identical lengths. FIG. 14A depicts several of the module types that make up family A. In FIG. 14B the elements that form a module's structure are shown to create a central ring under symmetrical stress. Within family A the foci that punctuate each module's central ring are equidistant. The linear elements emerge from each focus in opposite directions tangent to the ring. Two intersecting adjacent linear elements join to create each intermodular connection point. The ratio of the distance between two adjacent foci and the distance from each focus and its parent connection point approximates phi. Each module type within family A maintains the same geometric proportions regardless of scale or material composition.

Figure 15A:
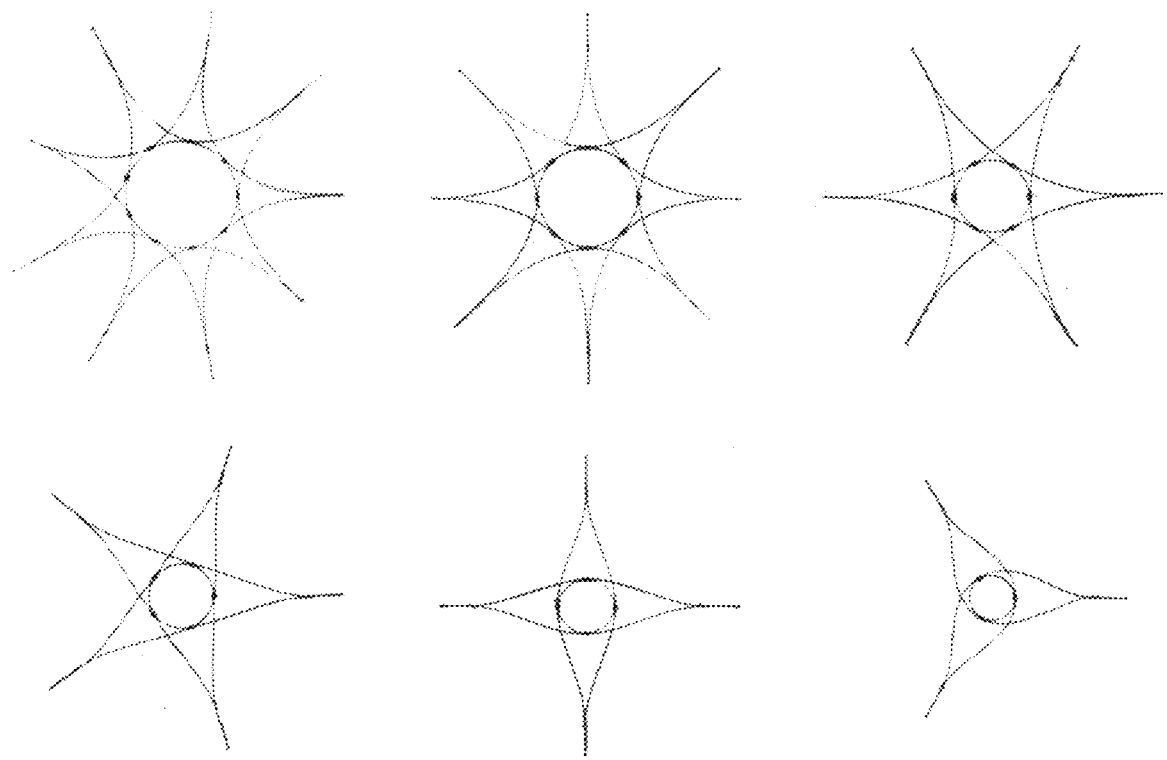
FIG. 15A shows a range of family B modules.
Figure 15B:
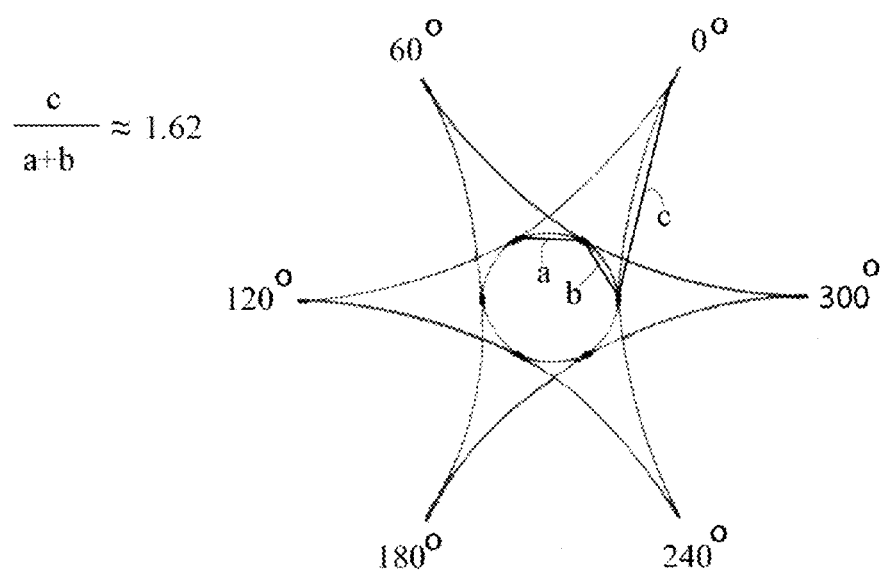
FIG. 15B shows the geometry a six-sided module within family B.

The modules of family B are radially symmetric structures composed of linear elements of identical length. FIG. 15A depicts several of the module types that make up family B. These modules have central ring structures that are under greater stress than family A module types. B type modules are designed to allow greater interconnectivity. Within family B the foci that punctuate a module's central ring are equidistant. Each module's linear elements emerge from the foci in opposite directions tangent to the ring. Two intersecting linear elements separated by a focus join to create each intermodular connection point. FIG. 15B illustrates that the ratio of the distance between three foci and the distance from each focus and its parent connection point approximates phi. Each module type within family B maintains the same geometric proportions regardless of scale or material composition.

Figure 16A:
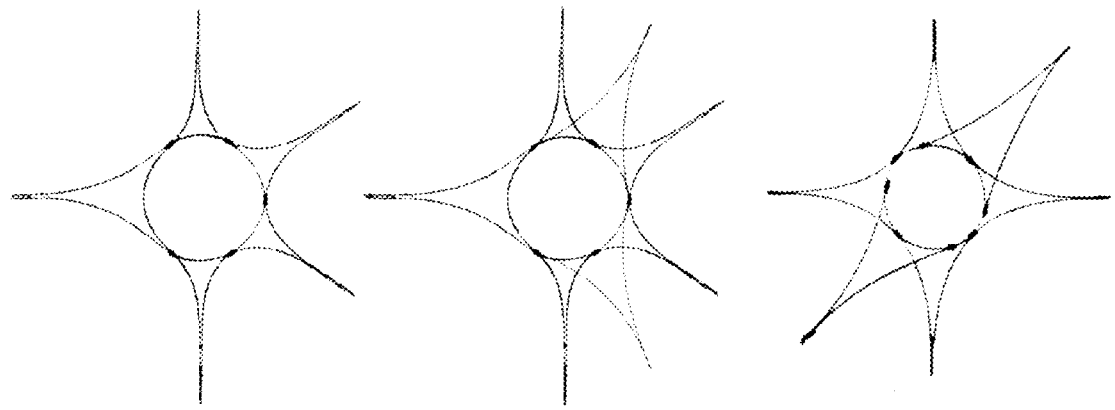
FIG. 16A shows a range of family C modules.

The modules of family C are radially asymmetric and bilaterally symmetric structures composed of linear elements of different lengths. The elements that form each module's structure create a central ring under asymmetrical stress. Three examples of bilaterally symmetric modules are shown in FIG. 16A. Family C modules are hybrids of family A and B modules and can incorporate the geometry found in each in any proportion.

Figure 16B:
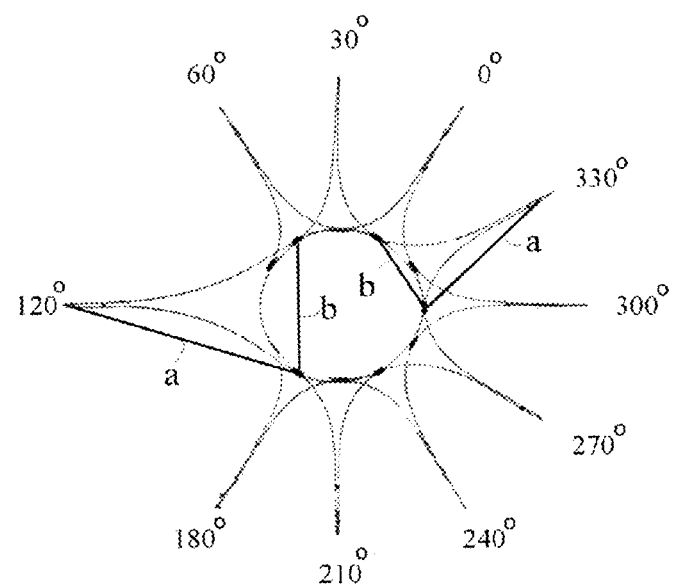
FIG. 16B shows the geometry a six-sided module within family C.

Within family C the foci that punctuate a module's central ring are not equidistant. The linear elements emerge from the foci in opposite directions tangent to the ring. Intersecting adjacent linear elements create intermodular connection points. In FIG. 16B the ratio of the distance between two adjacent foci and the distance from each focus and its parent connection point approximates phi. Each module type within family C maintains the same geometric proportions regardless of scale or material composition.

Figure 17:
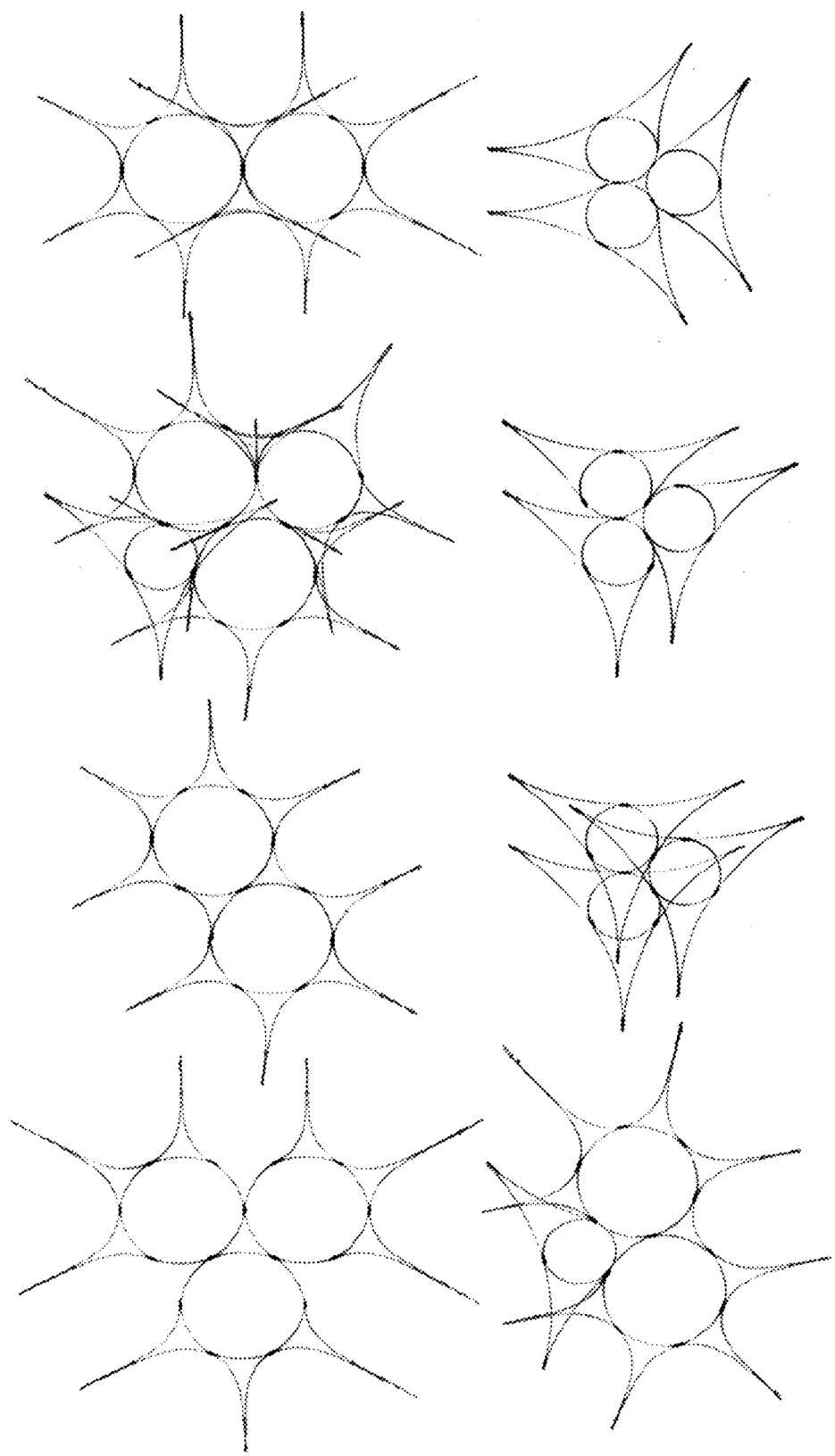
FIG. 17 shows a range of family D modules.

Examples of the modules found in family D are show in FIG. 17. These modules include radially asymmetric and symmetric structures composed of linear elements of identical and different lengths. The linear elements that form each module's structure create a central composite ring structure made up of at least two rings under symmetrical or asymmetrical stress. Family D modules are hybrids of family A,B and C modules and can incorporate the geometry found in each in any proportion. The ratio of the distance between two adjacent foci and the distance from each focus and its parent connection point approximates phi. Each module type within family D maintains the same geometric proportions regardless of scale or material composition.

Module Interconnection

Figure 18A:
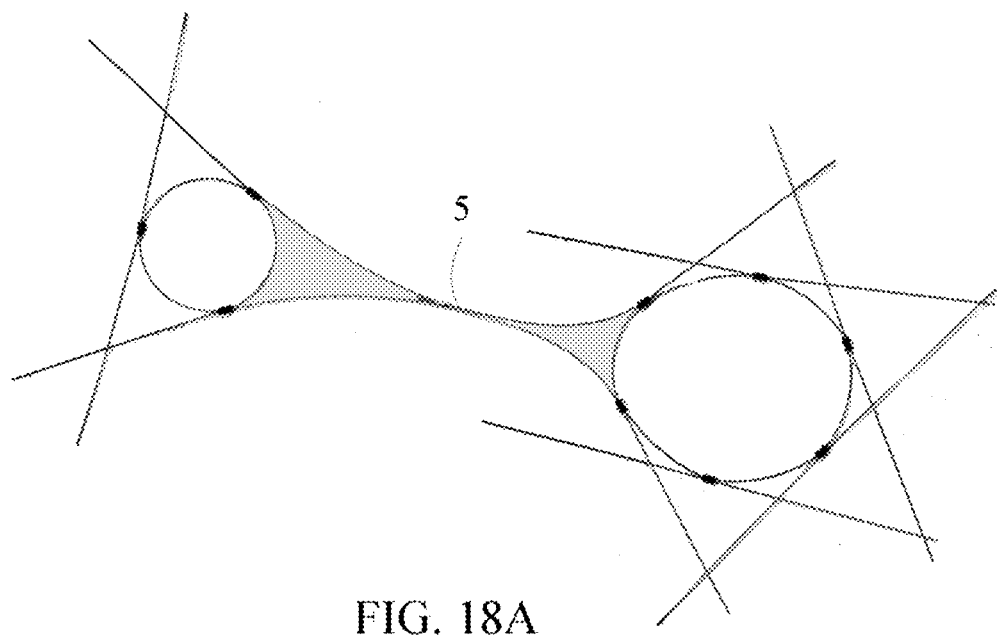
FIG. 18A shows a linear connection between two modules
Figure 18B:
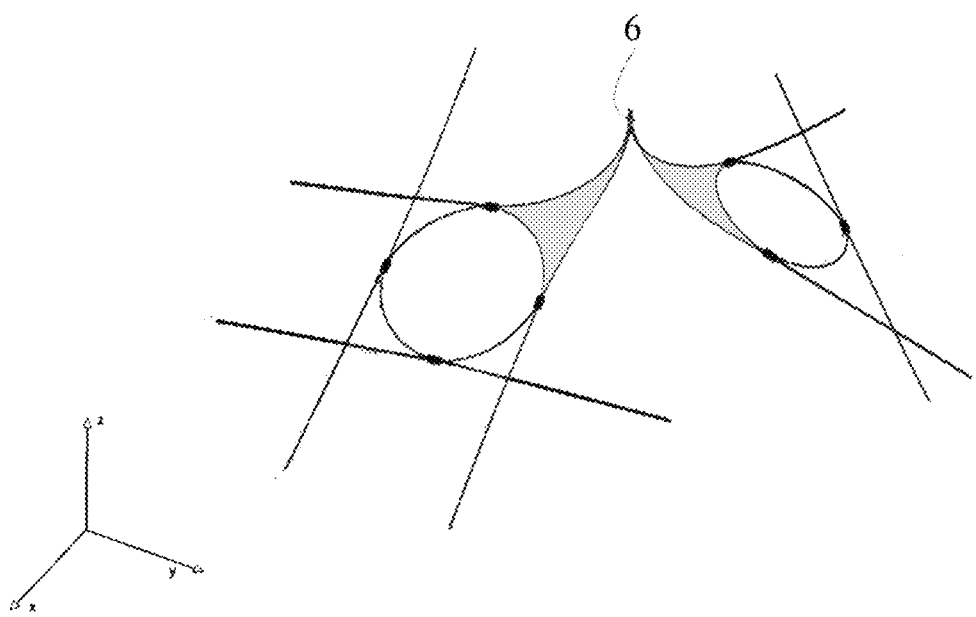
FIG. 18B shows a tangential connection between two modules

The modules that comprise family A,B,C and D can interconnect. There are two general intermodular connection types, linear connections and tangential connections. These modes of connection are depicted in FIGS. 18A and 18B. In FIG. 18A the label 5 marks a linear connection type, and in FIG. 18.B the label 6 marks a tangential connection type.

Figure 19:
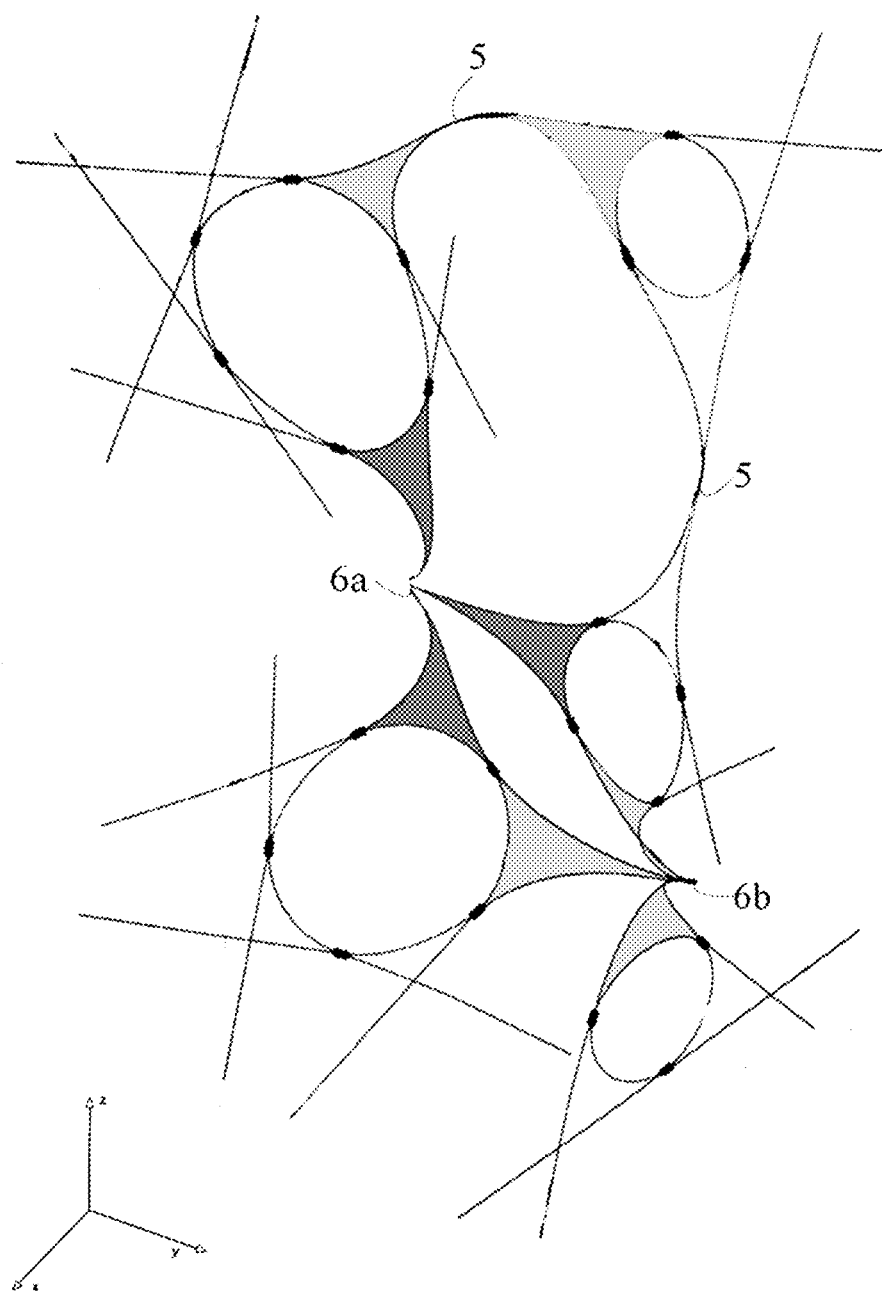
FIG. 19 shows the diversity of possible intermodular connection points.

Examples of various intermodular connections are shown in FIG. 19. They can include any number of modules connected at a single point. Connections at a single connection point can include both linear (5) and tangential (6*a*, 6*b*) connection types. Within an assembly of modules, the intermodular tangential connections can be inverted (6*a*) or everted (6*b*) in relation to the structure's interior.

Figure 20:
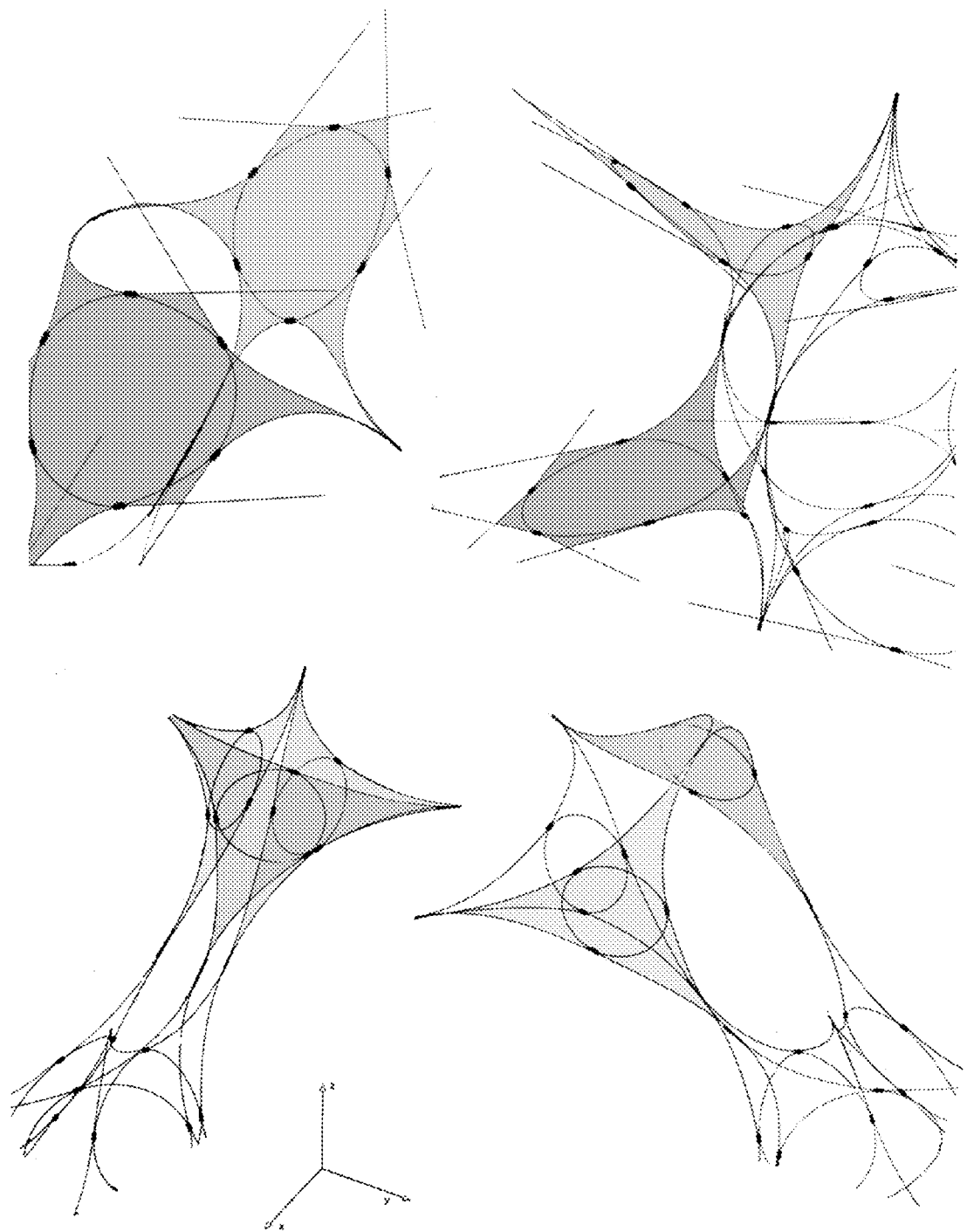
FIG. 20 shows several examples of structures built from family A modules.

FIG. 20 illustrates several connection scenarios; the modules depicted are all from family A. There is a vast number of possible geometric connection combinations that can be postulated given the module types within the four modular families, A, B, C and D.

Module Connection Hardware Types

Figure 21:
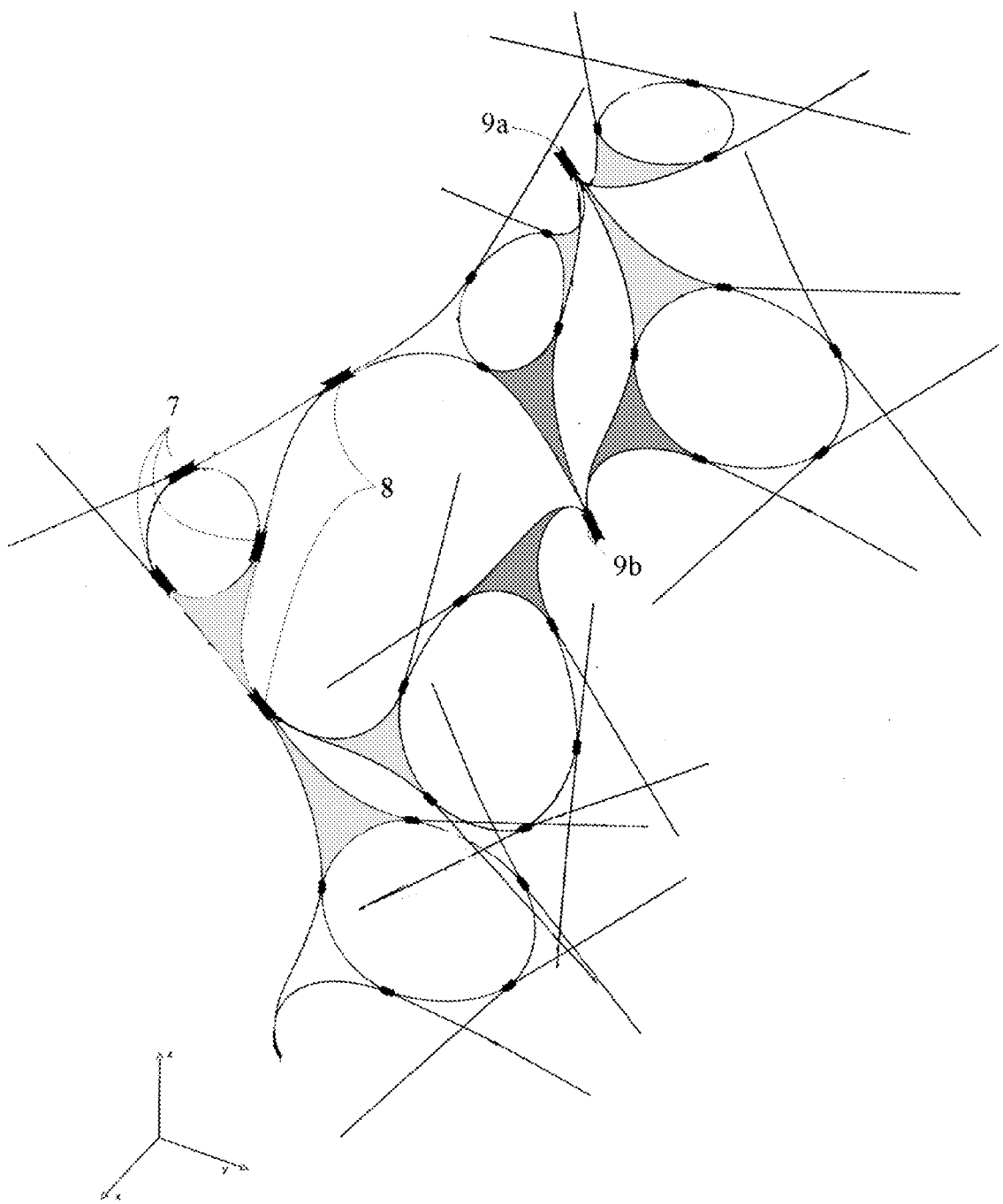
FIG. 21 shows examples of intermodular and intramodular connection types within a modular structure.

Intramodular and intermodular hardware types are shown in FIG. 21.

Intramodular hardware is used to form the modules out of linear elements. Focus Hardware, labled 7, is intramodular hardware. It joins two linear elements within the ring. It holds the linear elements in the correct position relative to one another. The hardware and the linear elements may require a linkage mechanism to maintain their appropriate position. A possible linkage mechanism could use hardware that receives/locks into a negative shape that is integrated into the two linear elements' surfaces.

Intermodular Hardware is Used to Interconnect Modules.

Joiner Hardware with Terminus labeled 9a and 9b is a type of intermodular hardware. This hardware forms tangential intermodular connections. The specific connection's juncture must all be inverted (9b) or everted (9a).

Bi-directional Joiner Hardware labeled as 8 is a type of intermodular hardware. This hardware facilitates linear connections and tangential/linear connection combinations made between modules. The specific design of the hardware used to connect the elemental parts of this invention is not specific to this invention.

The Structural Possibilities

Figure 22:
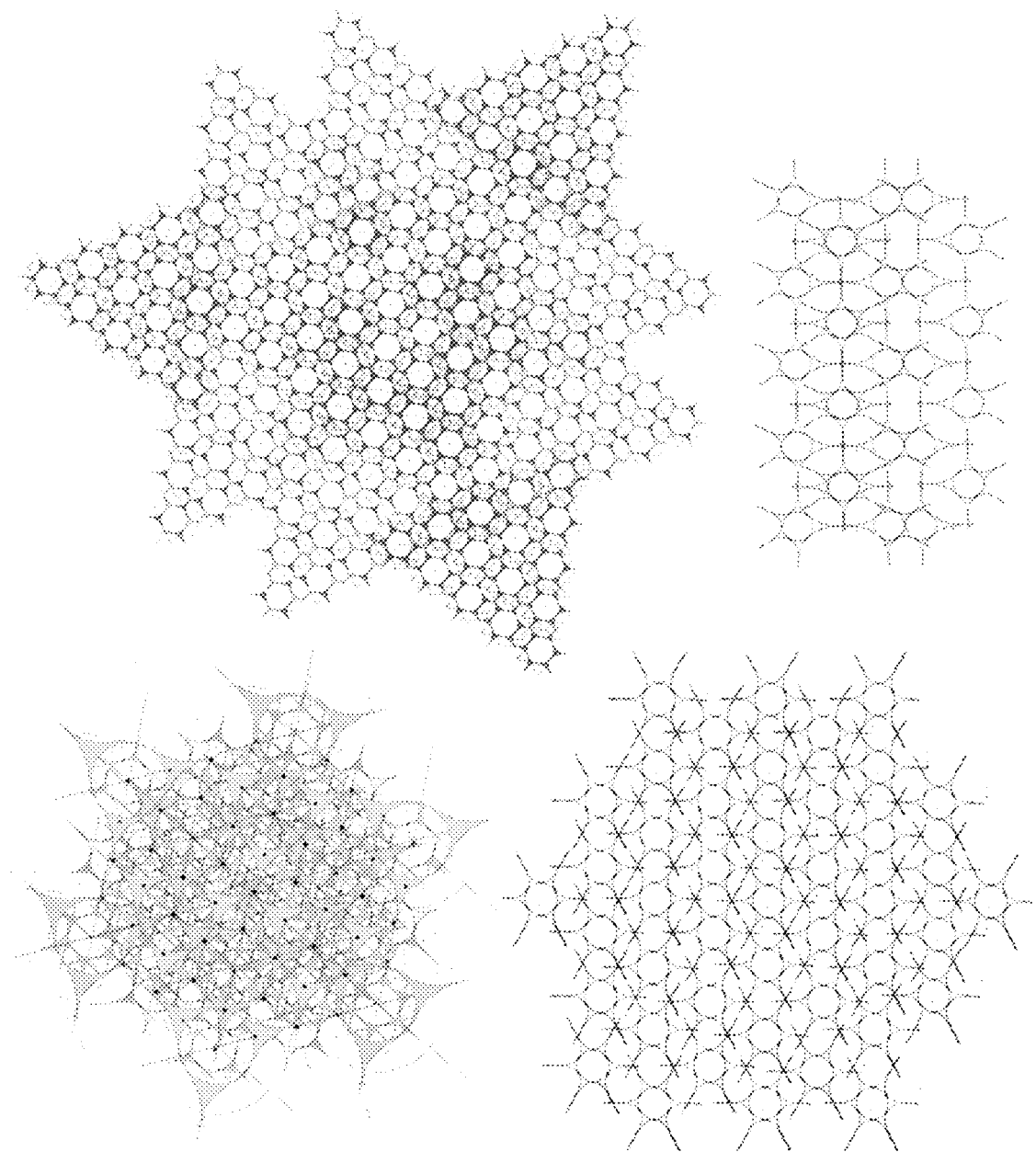
FIG. 22 shows examples of planer forms built of modules.

FIG. 22 shows examples of two planer structures built from several module types.

The shapes created using this system are not the invention. The purpose of this invention is to provide a means of creating shapes. The structures in this list are creatable using this modular system.

| planes (FIG. 22) | interconnected planes |
| --- | --- |
| dome | amorphous shape |
| branching helixes | quasicrystaline, planes, spheres . . . |
| helix-single, double, triple . . . | polyhedra |
| arch | sphere |
| branching tubes | tube |
| matrix-hexagonal | pentagonal, cubic, tetrahedral . . . |

This invention naturally creates structures composed of curved linear elements under tension. The tension within the structures is a result of the composite material elements being put under stress during assembly.

If a smart programmable material is used, the module's material is adjusted to be as flexible as possible during assembly. After connection to the network, the material is tuned to physically support further assembly. Module rigidity within the network during assembly would be uncommonly high.

The exception would be the elements within the module that are not yet connected to other modules. This scenario would help to stabilize the structure and facilitate growth by making modules easier to attach.

The finished assemblies are three dimensional networks under tension. These structural networks can vary greatly in their level of complexity and internal tension. This invention can be used to create structures of any scale. Its full implementation is contingent upon the development of structural smart tunable materials. This building system is composed of an array of anisotropic modules capable of being assembled into greater anisotropic and isotropic structures.

The anisotropic structures built from this modular system comprise many curved linear elements under tension. Their anisotropic geometry allows these structures to predictably morph when built of smart materials with tunable stiffness. The physical orientation and stress placed on the material making up the structure guides its morphing trajectory along lines of stress that are created by the curved material. The structures' internal forces and geometry predispose the structures' behavior.

Figures 23A, 23B, 23C:
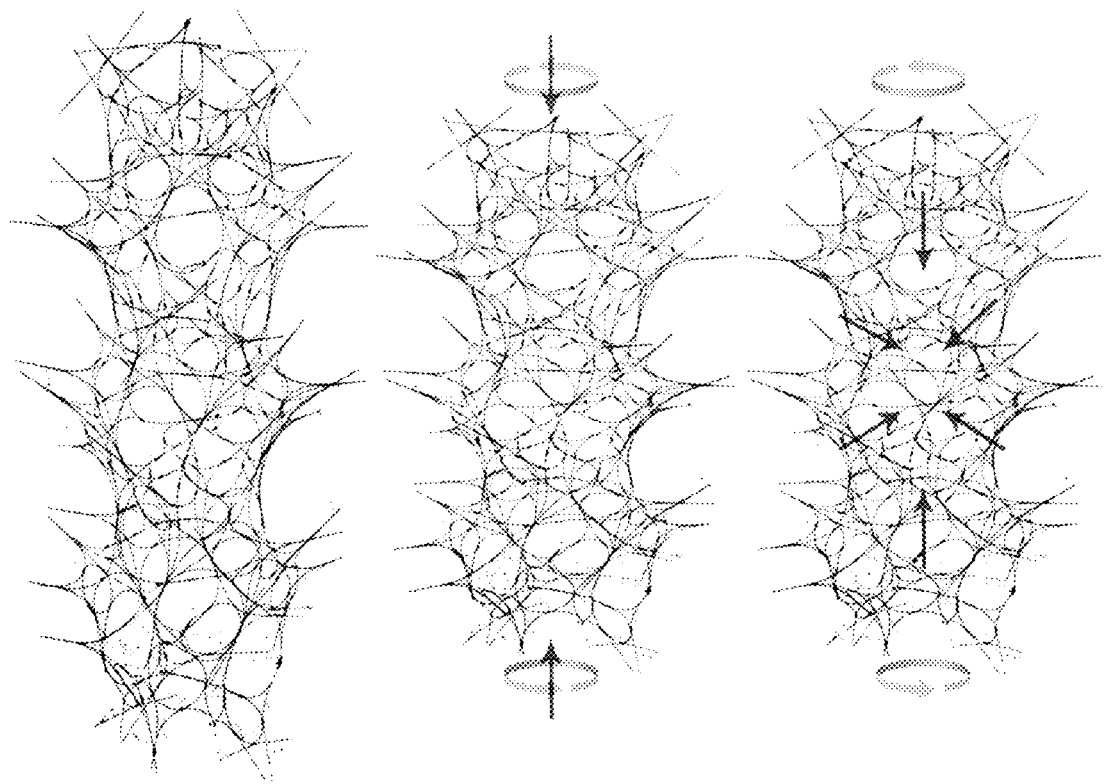
FIGS. 23A, 23B and 23C show a double helix in various stages of morphing.

In FIGS. 23A, B and C a helix built from this modular system is used to illustrate structural morphing. FIG. 23A shows the helix in its equilibrium state prior to any morphing. The morphing of a structure can be both passive and active. Passive structural morphing of an anisotropic structure is expressed when external pressure is applied along its axis of anisotropy, for example the compression and/or coiling of a helix. This scenario is illustrated in FIG. 23B. Active structural morphing of an anisotropic structure can occur through the active tuning of the material that composes it. For example, the reduction of stiffness within the elements making up a helical structure will cause it to recoil as represented in FIG. 23C. Most real world applications would use both passive and active forces to morph a structure.

If a structure's unit elements are configured to form a passive isotropic structure (isotropic and built of conventional material), the potential energy stored in its deformed elements would make the structure elastic, robust and energy rich.

Figure 24A:
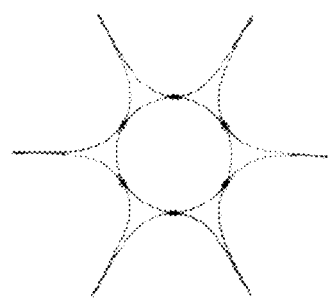
FIG. 24A through 24D show the progressive assembly of a structure from elemental parts to higher order structure.
Figure 24B:
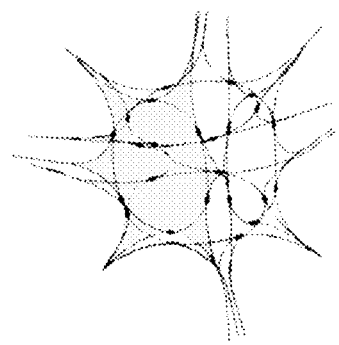
Figure 24C:
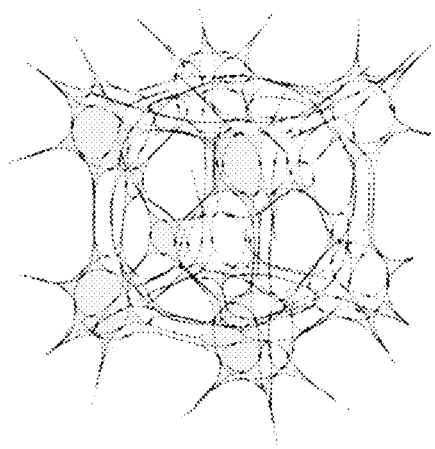
Figure 24D:
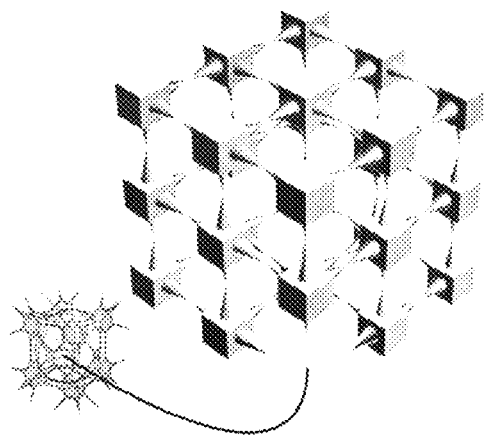

Isotropic and anisotropic lattice structures can be built using this system. The modules are combined into self-similar units that interconnect to form a higher order self-similar structure. FIG. 24A, B, C, D illustrates how the assembly of self-similar units results in further self-similarity. The sequence of assembly begins with a single module as shown in FIG. 24A, becoming a module cluster shown in FIG. 24B, becoming a module cluster assembly shown in FIG. 24C, becoming a high order lattice shown in FIG. 24D. This sequence is an example of this invention's ability to create higher order structures, the pinnacle structure being quasicrystaline.

Current building systems describe digital assemblies that appear as inorganic crystalline lattices. When compared to this invention, these systems appear to have limited structural possibilities. This invention describes a digital building system inspired by organic chemistry. With this building system, it may be possible to build smart digital material structures that can become anisotropic or isotropic on command.

The structural and behavioral complexity of organic compounds makes them an ideal model for the development of a futuristic building system inspired by nature, i.e. a system of muscular modular elastic structures built of acutely controllable linear elements.

Figure 25A:
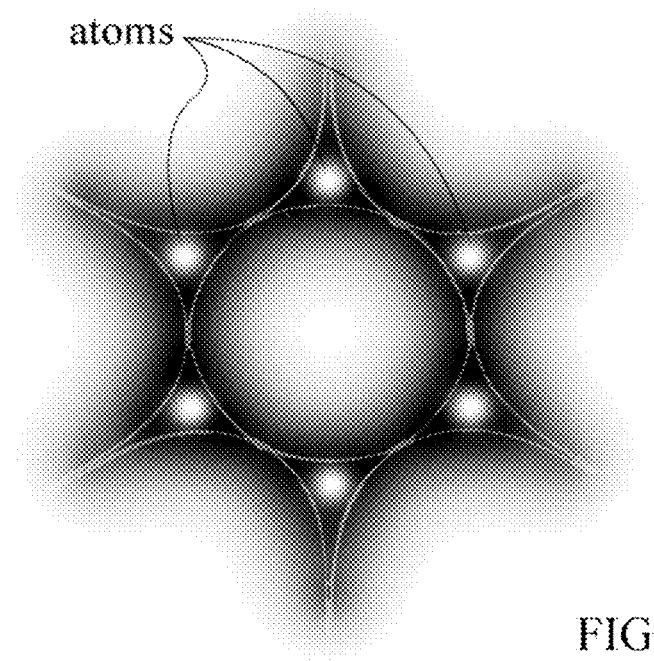
FIGS. 25A and 25B show the similarity between the linear elements that make up a module and the atoms that make up a module.
Figure 25B:
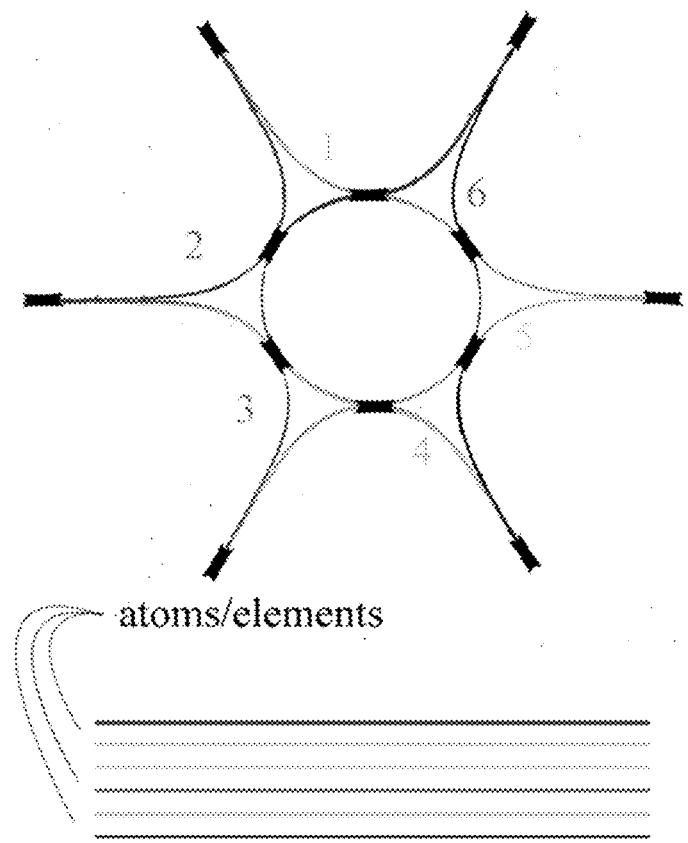

The individual linear elements that make up a module are unique digital units. Each digital unit can be given a specific address within the structure and its material tuned at will. FIG. 25A represents a benzene molecule and its component atoms. Its module analog is shown in FIG. 25B. The atom to linear element relationship seen in FIGS. 25A and 25B illustrates that both atoms and elements are the digital components of a greater elastic structure.

The individual elements that make up a larger modular structure are analogues to atoms, i.e. the elements that make up the individual modules are the elemental/digital building blocks of the greater structure.

Like organic molecules, structures built using this invention comprise elements that interact to form larger elastic structures. A structure assembled from this system's modules is a structural network made up of individual connections and their associated elements. The connections are integral to the network's structural integrity because those connections put the assembly under tension. If one element's structural characteristics are altered while it is part of the network, that change will be felt throughout the network.

Figure 26A:
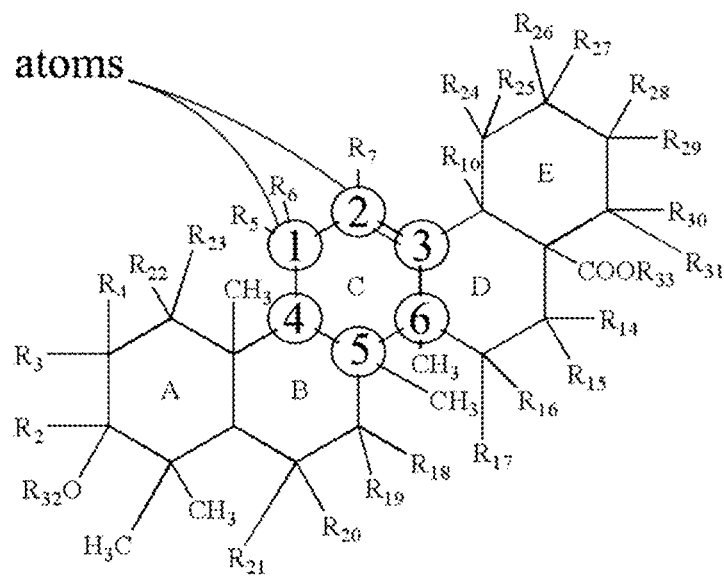
FIG. 26A shows a modular network in the form of a molecular structure.
Figure 26B:
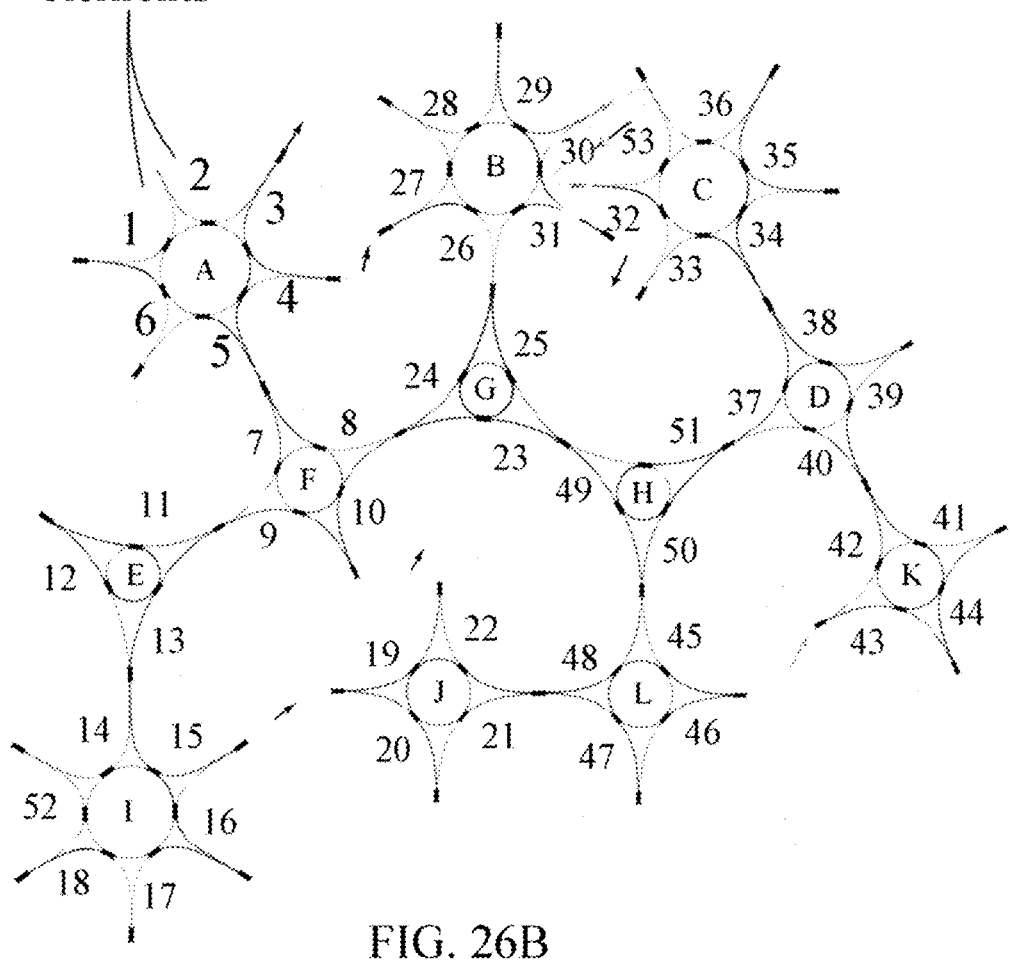
FIG. 26B shows a modular network built using this invention.
Figure 27A:
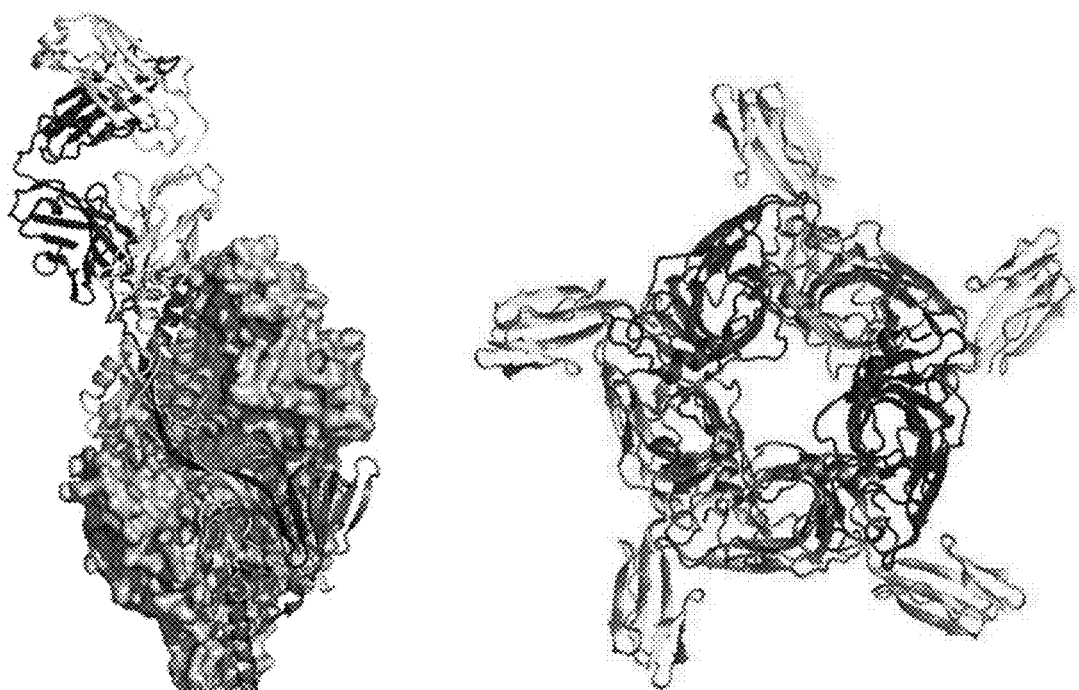
FIG. 27A shows macromolecules pre-conformational change.
Figure 27B:
FIG. 27B shows macromolecules post-conformational change.
Figure 27B:
Figure 27B:
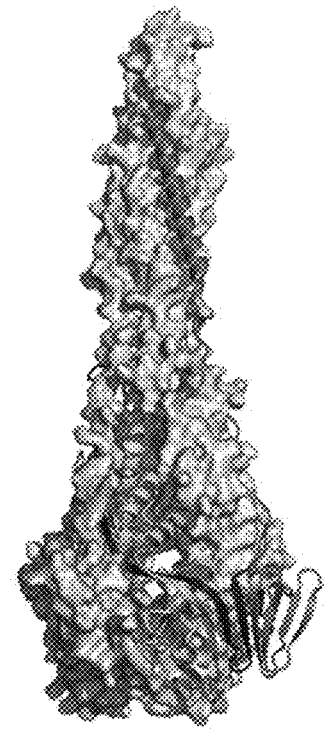
Figure 27B:
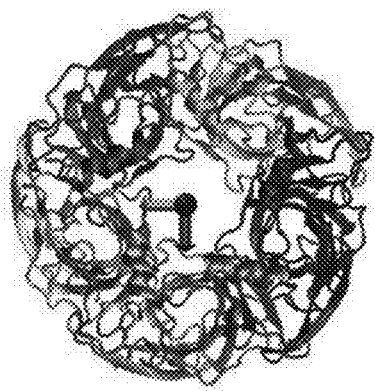

In FIGS. 26A and 26B the atoms that make up a molecule and the elements that make up a structure built from this invention are represented as two networks. The number and letter system seen in FIGS. 26A and 26B represents a possible method of spatially addressing each element in the network. Imagine the macromolecule depicted in FIG. 26A as being a network of atoms/elements, each atom having an address and controllable bond strength. As an individual atom's bond characteristics are altered so would the molecule's shape. Similarly the modular structure seen in FIG. 26B is a network made of elastic elements. If each composite material element within this modular structure has controllable/adjustable physical properties, the structure they comprise would have highly controllable shape morphing properties.

Because carbon based composite materials are conductive, electrical energy can be transferred throughout the structural network. Electrical energy in the form of information or energy to perform work can be distributed to each element throughout the network.

Information reaches all the elements within the network. Each element (i.e. atom) in that network (i.e. molecule) is assigned an address. Given that you can communicate with each element and given that you can control the behavior of that element per-instruction, a great deal of behavioral and structural control can be achieved.

The active tuning of a structure in an effort to achieve complex behavior would require the coordination of all the structure's unit elements through some type of spatial programming.

Active element to element communication regarding stresses would enhance the system's functionality. For example, a physically asymmetric structure under changing loads could have its internal stresses actively modulated by tuning The controlled weakening of specific areas within a structure would cause the stored elastic energy to be directed toward critical areas that could trigger dynamic shape changes to occur. This is analogous to the macromolecular conformational change illustrated in FIG. 27.

There are many different applications for structures capable of shape change, whether it be uniform morphing or conformational changes within regions of a structure.

Hybrid structures made up of conventional composite material with strategically placed tunable material clusters may be a good option where gross structural changes are desired.

Shape changes within regions of a structure can be temporary as in a system that performs work by altering its shape repeatedly or permanently as in a structure designed to unfold and lock into place.

This invention can be used to form macroscopic, microscopic, simple or complex structures. It is well adapted to the use of conventional high performance material and smart material.

Ideally this invention forms a high resolution digital material network comprising elements with acutely controllable elastic modulus. The smart tunable material composing a structure would function as skeleton and musculature.

The concentration of tunable elements making up a structure can impact its strength and its morphing characteristics. Diverse element densities can exist within the same network structure. These elastic network structures may have behavioral and structural similarities to biological muscle tissue.

Figure 28:
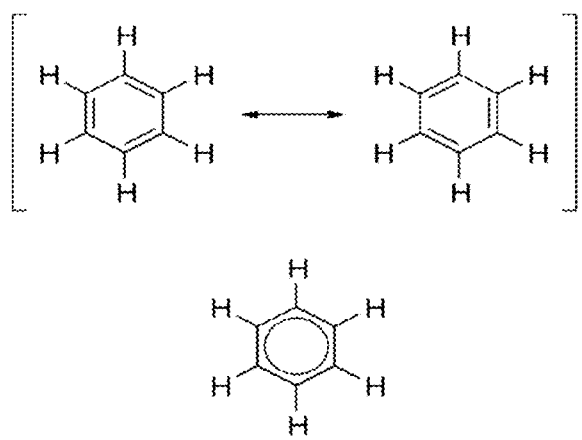
FIG. 28 shows a fundamental example of a resonant structure.

The elastic energy stored within the structure would enhance its ability to actively morph structurally. Elastic potential energy may be directed toward the propagation of wave forms within the structure. Very efficient oscillating behaviors within a structure would require the active tuning of the smart material to the geometry of the structure itself and/or the material it is interacting with. An example of a resonance structure from organic chemistry is illustrated in FIG. 28. The concept of resonance could be applied to physical structures built from this invention. Resonance could be used to create modular structures that require reduced energy when maintaining a state of increased strength. Most energy is used reaching the desired resonance and then maintained at a much reduced level.

Smart carbon based materials can potentially have the active deformative property of muscle and the power generating capabilities of piezoelectric materials. Because of this, energy could be harvested and transferred from within the structural network as it changes shape. For example, the active release of tension on one side of a structure would cause the opposite side to sympathetically output energy.

Figure 29:
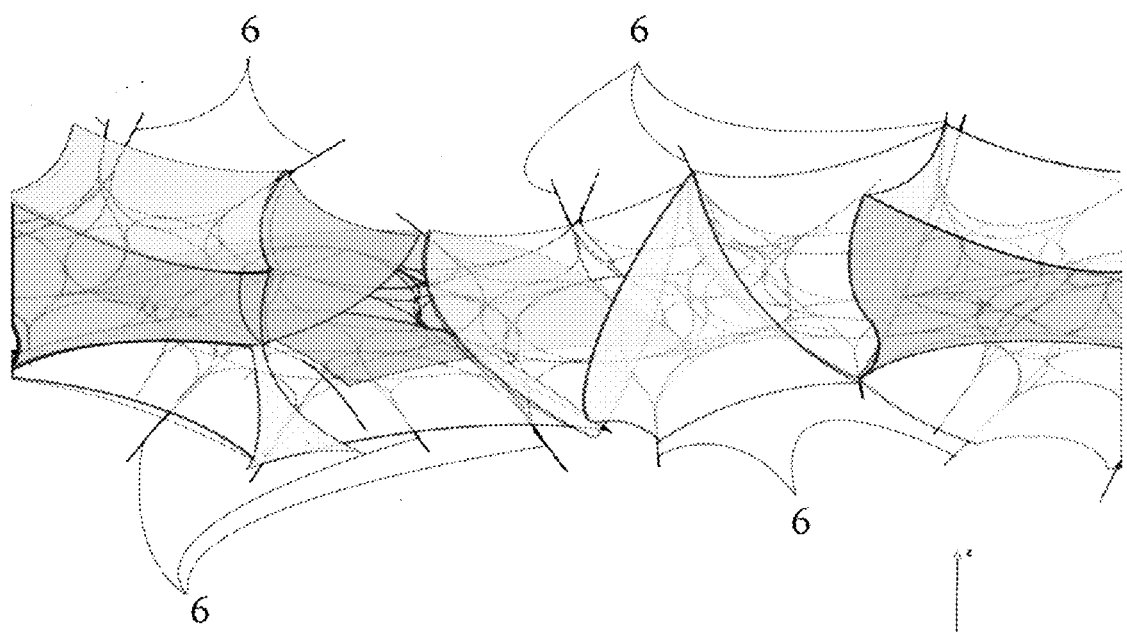
FIG. 29 shows a helical structure with integrated membrane elements.

The structures created using this invention are capable of integrating membrane elements into their structure. As illustrated in FIG. 29, the tangential connection points (6) described in FIG. 19 are well suited to the attachment of these membranes. Everted or inverted tangential connection points as shown in FIGS. 19, 6a and 6b can receive the membrane elements.

Once attached to the tangential connection points, the membrane elements become part of the structural/behavioral network. The membrane elements may be composed of a type of active material. For example, muscular membrane elements made of a smart carbon based material could be used. These membrane elements would function along with the linear element to form a higher level musculoskeletal network. The tangential connecting points could also function as anchor points for many thin films, including flexible solar.

Benefits and Applications

This building system allows the creation of structures that are more complex than those built using conventional systems. The use of smart materials requires a paradigm shift in construction techniques. It will soon be possible to build impossible things.

Whether built of passive high performance composite materials or smart composite materials, this invention's modular building system has novel applications in the fields of architecture, structural engineering, aerospace, robotics, art, etc.

With most building systems, modification to an existing structure is a difficult and wasteful process. This invention's modularity and elasticity is well suited to extensibility; this system is designed for growth.

To take advantage of the exotic properties of present and future composite materials, a system capable of building very complex forms that cannot be built today is needed. This invention's repertoire of modules can combine to form a vast range of novel digital material structures. Each novel structure could become a product tailored toward a specific function.

Current building techniques create structures under less tension than those created with this invention. Because of this lack of tension and elasticity, current systems are less structurally integrated and more apt to structural failure.

The elastic nature of the products built using this system would be well suited to extreme terrestrial and space environments. Regions subject to extreme weather events would benefit from this system.

Scales of Use

This invention could be used to build large structures, for example, an expansive domed roof that becomes more convex in response to a load. A roof of sparse, light, interconnected muscular modules could harvest energy from the wind and act as understructure for flexible solar. The module size for a dome assembly would be relatively large.

As the scale of a modular structure increases so may the scale of the module. Various module scales can be used in the same structure. A bridge's or building's superstructure would be similarly treated.

This system is well adapted to space applications because its parts are light, reusable and modular. For example, morphing structures would function efficiently in micro gravity. Quasicrystalline space muscle could transition from a plane into a sphere; it could function as a platform for space solar or adaptable parabolic reflector.

Power could be generated with a large sparse piezoelectric planer structure floated on the ocean. The plane could function as an adaptive network that alters its own structure to harvest the most energy from wave action.

This system could be used to build mid-scale muscular structures that exhibit undulation, oscillation or sinusoidal behaviors, an example of each being an undulating planer structure that swims, a dirigible consisting of an oscillating network structure that is both structural and also acts as a mode of propulsion, and a tubular structure that exhibits sinusoidal locomotion or other snake like modes of locomotion. Muscular tubes could also exhibit peristaltic action.

A micro scale example could be a nano-robotic sphere that is micro assembled from smart fibers forming a nano-digital material network structure.

Education and Modeling

This invention could function as a template for a physical building set and virtual building program. Both the physical and virtual systems use the same component modules. These two methods of building would compliment one another. The methods could be used to design and model the behavior of carbon allotrope structures and also used as a classroom learning tool.

A physical construction set comprising modules based on this invention could be used to teach mathematics, chemistry, engineering and art. This building activity would be conducive to nurturing spatial skills, manual dexterity and general creativity. A person doing hands on building with this system would gain insight into the internal forces that structures like molecules, bridges and networks are under.

A physical building kit would allow the builder to assemble and discover structures that may be unknown and could have real world applications. Because this modular building system is based on the way nature builds, a person will find structures seem to emerge as they build. Visualizing the way things need to go together is important, but recognizing serendipitous geometries that just happen is equally important.

The assembly of these modules in a virtual environment would be a powerful tool, and if the software is very sophisticated would be superior to building physical models in many respects, i.e. the simulation of a system's behavior when smart materials are used. The software program would contain all the module types and allow their assembly in three dimensions. The physical properties of each module and that of the overall structural network would be simulated and also their response to external force modeled.

The software could be very helpful when designing smart structures. The software platform could allow for the use of specific material types, sensors and peripheral electronics. It could also introduce and simulate programmed and learned behavioral scenarios. There are existing software models related to the molecular assembly that might be modified to this propose.

An online game based on this software could be developed that may help in the discovery of exotic carbon allotropes, a game similar to Foldit.

The invention claimed is:

1. A modular unit comprising at least three one-piece elastic linear elements having a length, sides and ends, each of the linear elements coupled with an intramodular connector at two points along the length of the linear element to the sides of the other elements, said linear elements between the intramodular connectors forming a ring with each linear element being under tension and the ring under stress, said linear elements tangentially exiting the ring, said linear elements exiting the ring between adjacent intramodular connectors joined together with intermodular connectors whereby said modular unit has stored elastic energy, said intermodular connectors connecting the ends of the linear elements.

2. A product comprising a discrete repertoire of modular units of claim 1, composed of composite material and assembled into secondary modular assemblies by connecting the modular units with their intermodular connectors linearly or tangentially.

3. The product of claim 2, wherein the composite material composing the modular units has less than an infinite modulus of elasticity and that level of elasticity is either fixed in a material's composite structure or is controlled through the use of a smart composite material.

4. The product of claim 2, wherein the composite material is carbon based.

5. The product of claim 3, wherein the composite material is a smart composite material having programmable elasticity and a shape of the product is controlled through the use of the smart composite material having programmable elasticity.

6. The product of claim 2, wherein the discrete repertoire of elastic modular units are all the same dimension and formed as an integrated unit through molding or 3d printing.

7. The product of claim 2, wherein the elastic linear elements have a circular or other geometric shape.

8. The product of claim 2, wherein the ratio of the distance between adjacent intramodular connectors and the distance between said intramodular connectors and the intrermodular connector between the adjacent intramodular connectors approximates phi and said modular units are deformed and topologically unaltered.

9. The product of claim 2, wherein the intermodular connectors between the modular units may make singular or multiple connections and may include inverted, everted or linear connection types.

10. The product of claim 9, the modular units are all equally able to connect to the other modular units with inverted, everted or linear connections.

11. The product of claim 5, wherein the stored elastic energy affects the deformation and reformation of the modular assemblies.

12. The product of claim 5, wherein the intramodular connectors electrically isolate the coupled linear elements in the modular units whereby circuits are created within the modular units to morph the shape of the modular assemblies.

13. The product of claim 2, in the form of a physical modular assembly set for teaching of math, chemistry, art and physics.

14. The product of claim 2, in the form of a computer programmed to provide a virtual modular assembly set.

\* \* \* \* \*